United States Patent [19]
Mohindra et al.

[11] Patent Number: 5,542,441
[45] Date of Patent: Aug. 6, 1996

[54] APPARATUS FOR DELIVERING ULTRA-LOW PARTICLE COUNTS IN SEMICONDUCTOR MANUFACTURING

[75] Inventors: Raj Mohindra, Los Altos Hills; Abhay K. Bhushan; Rajiv Bhushan, both of Palo Alto; Suraj Puri, Los Altos, all of Calif.

[73] Assignee: YieldUP International, Mountain View, Calif.

[21] Appl. No.: 285,316

[22] Filed: Aug. 3, 1994

[51] Int. Cl.⁶ ................................................. B08B 3/04
[52] U.S. Cl. .................... 134/95.2; 134/95.1; 134/98.1; 134/99.1; 134/104.1; 134/902; 134/110; 210/638; 641/900
[58] Field of Search ................... 134/902, 95.1, 134/95.2, 99.1, 100.1, 102.1, 102.2, 104.1, 110, 98.1; 210/900, 638, 641, 195.2, 243

[56] References Cited

U.S. PATENT DOCUMENTS

| | | | |
|---|---|---|---|
| 3,252,885 | 5/1966 | Griswold | 210/243 X |
| 3,973,987 | 8/1976 | Hewitt et al. | 134/902 X |
| 4,655,909 | 4/1987 | Furuno | 210/900 X |
| 4,917,123 | 4/1990 | McConnell et al. | 134/902 X |
| 4,990,260 | 2/1991 | Pisani | 210/900 X |
| 5,073,268 | 12/1991 | Saito et al. | 210/900 X |
| 5,128,043 | 7/1992 | Wildermuth | 210/900 X |
| 5,160,429 | 11/1992 | Ohmi et al. | 210/900 X |
| 5,190,065 | 3/1993 | Kovac et al. | 134/902 X |
| 5,331,987 | 7/1994 | Hayashi et al. | 134/902 X |
| 5,377,708 | 1/1995 | Bergmann et al. | 134/902 X |

*Primary Examiner*—Philip R. Coe
*Attorney, Agent, or Firm*—Richard T. Ogawa

[57] ABSTRACT

The invention relates to a wafer rinsing system for rinsing chemicals and particles off of wafers without introducing contaminants. The system reduces the particle count on wafers by filtering the water and the gas used during rinsing at the wet bench. The system includes a rinsing unit, a local water filter bank, a local gas filtering system, an $H_2O_2$ injection unit, an auxiliary chemical injection unit, and a controller for operating the other components. The water filter bank provides a multiple stage filtering system to eliminate particles without a substantial drop in water pressure. The $H_2O_2$ injection unit provides a local source of $H_2O_2$ to clean the filter and rinser and to provide a mechanism for controlling the formation of native oxide on the wafer during rinsing. The auxiliary chemical injection unit provides a chemical additive to the rinsing unit to enhance the wafer cleaning process. The gas filtering system provides clean gas to the rinsing unit and to the injection units. The clean gas provides a clean atmosphere over the chemicals in each injection unit, and over the water in the rinser.

30 Claims, 19 Drawing Sheets

APPARATUS FOR DELIVERING ULTRA-LOW PARTICLE COUNTS IN SEMICONDUCTOR MANUFACTURING

BACKGROUND OF INVENTION

1. Field of Invention

The present invention relates to the wet-processing systems used in microelectronic fabrication. More particularly, the present invention relates to the systems used for cleaning after microelectronic device manufacturing process steps such as the pre-diffusion cleaning, wet etch processes, photoresist removals and other cleaning operations.

2. Description of the Related Art

Particle contamination is an important source of semiconductor chip yield losses. As chip geometry becomes smaller, even very small particles, such as those less than 0.1 microns in diameter, can cause defects that decrease yield and product reliability. Despite the importance of this problem, major gaps exist in industry knowledge and technology. This problem is especially acute for the wet processes and rinse systems.

The microelectronic devices are typically processed using chemical solutions and rinses. For example, a semiconductor wafer is typically made from silicon with various materials implanted or diffused into or applied on the surface. During a wet etch step in the process, a group of wafers to be etched are placed in a container called a boat that is placed in a chemical solution. After this, the boat is removed from the chemical solution and rinsed with deionized (DI) water to stop the etch. The rinse can also help remove particles that happen to adhere to the wafer. Unfortunately, the water used in rinsing process can introduce particles that adhere to the wafer. *Handbook of Quality Integrated Circuit Manufacturing* by Robert Zorich, ISBN 012-781870-7 provides a description of circuit manufacturing techniques and concerns, and the entire disclosure is hereby incorporated by reference.

Some operations in semiconductor manufacture require that there be no oxide layer on the wafer. However, if any particles contact the bare wafer after bathing in hydrofluoric acid (HF) before a protective oxide layer is formed, the particles may strongly adhere to the wafer. Further, a thin protective oxide layer forming whenever bare silicon is exposed to oxygen may protect against further reactions and contaminants but will not always reduce particle contamination. For example, when the oxide layer is formed on the wafer from contact with air, water may not effectively rinse the particles from the surface.

Techniques for Wafer Cleaning

Certain techniques for removing particles from wafers have major disadvantages. Wet chemical cleaning, for example, may add particles. Scrubbing is unsuitable for the removal of submicron particles, and can damage wafers. Pressurized fluid jets may damage wafers and lead to electrostatic charge build up that can also damage wafers. Ultrasonic cleaning can damage wafers, does not allow the use of reactive solutions, and makes it difficult to control cavitation. Megasonics may introduce contamination from chemical solutions. Strippable polymer may leave a deposit of polymeric residue and has not been demonstrated to be effective. Using UV light with ozone has not been proven effective for particle removal and can damage the wafer.

There are two general techniques for rinsing wafers both of which involve placing a boat into a tank of DI water. Cascade rinsing uses a continuous flow of DI water that spills, or cascades, over the top of the tank. Quick-dumping rinsing evacuates the water from the tub as quickly as possible.

Sources of Contaminants During Rinsing

Particles contaminating the wafer during the rinsing process come from the rinse water and air. Waterborne particles can be introduced from the pipes of a DI water distribution system. In a semiconductor foundry, DI water is typically purified from the local water supply at a central facility and then supplied to wet benches throughout the foundry by the distribution network. Even if pure water leaves the central facility, bacteria growing in the pipes can enter the rinsing system, and contaminate the wafers. In addition, the inner surface of the piping itself can introduce particles.

Operating a clean air and water distribution network throughout the foundry presents an economic problem. Different parts of the manufacturing process place different demands on the cleanliness of the air and water. For example, post-HF wet processing requires extremely clean air and water, while other operations may be less susceptible to particle contamination. The cost of operating a cleaning facility is related to the degree of cleanliness and the volume of water required. Using only a centralized purification system requires that all of the air and water purified for all of the foundry that meet the requirements of the most demanding operation. Because only a relatively small amount of air and water needs to be of the highest purity, this may result in an unduly expensive central water purification system.

To help eliminate contaminants that develop in the water distribution system relying on centralized purification, the entire system may be purged. For example, an $H_2O_2$ purge and DI water flush can remove bacteria growing in a DI water system. In such a centralized system, however, wafers cannot be produced while the system is being purged, causing production delays and shutdown of some operations. Consequently, such steps may be taken only when contamination problems become acute. This exposes the wafers to significant levels of impurities in the water between the system purges.

Airborne Contaminants

Rinse systems also expose the wafers to airborne contaminants when the wafers are exposed to air in being transferred to the rinse tank. One way of processing wafers involves putting wafers in a full tank, and then repeatedly emptying and filling the tank with DI water. When the wafers start the emptying-filling process, they are immersed in water. In quick dumping systems, room air displaces water as the water leaves the tank. This exposes the wafers to airborne contaminants. As the tank refills with water, the DI water displaces the air surrounding the wafers.

Rinse systems are also prone to contamination arising from bubbles that develop when the DI water enters the tank in a rinsing system. Very small bubbles are referred to as micro bubbles. Bubbles arise from turbulence and pressure changes that occur where a pipe or channel carrying the water, changes dimensions or mixes with air. The bubbles may trap particles which can then be deposited on the wafer surface if the bubble contacts the wafer surface.

Dissolved Oxygen

Dissolved oxygen in the rinse water may also present problems. Dissolved oxygen affects the corrosion rate of metallic materials contacting the DI water. Ion exchange resins are also oxidized by dissolved oxygen which degrades the resin and shortens its life. In addition, the growth of bacteria in pipes and equipment is accelerated by dissolved oxygen. Accordingly, foundries are reducing the amount of dissolved oxygen in their DI water. However, removing the dissolved oxygen can impede the formation of a native oxide film on the wafer.

Particle Protection Techniques

Wafers are exposed to airborne contaminants at different stages in the process. One method to protect wafers from airborne contaminants is to put the wafers in special enclosures during transport between process steps. However, this does not solve the problem of impurities in the DI water, chemicals and air in the rinse equipment. Another method of minimizing contamination involves the use of isopropyl alcohol (IPA) vapors for cleaning and drying the wafers during and after the rinse step. This is environmentally undesirable and expensive.

In some applications, it is useful to clean the wafer with a solution containing one or more cleaning agents. One method of doing this is to bathe the wafer in one tank with a cleaning agent, and then move the wafer to a different tank for rinsing. This requires having multiple tanks and exposes the wafer to contaminants while being transported from one tank to another.

SUMMARY OF THE INVENTION

An aspect of the present invention provides systems and methods for obtaining low particle counts in wet processing systems, even in foundries with average or relatively poor quality DI water and air. In various embodiments, the present invention include point-of-use purification of DI water and air, injection of additives for cleaning, bacteria control and process improvements, parametric control of fill, flow and dump rates, and features to prevent bubbles and micro-bubbles.

One embodiment of the present invention provides a point-of-use DI water purification system using charged and neutral filters. The filtering system is designed to maintain high flow rates with low pressure drops while providing low particle counts. In an additional feature, a shielding system is provided to prevent accidental particle discharges that may be caused by external electromagnetic disturbances. A multiple filter system can be provided to extend the life and improve flow performance and to maintain filter effectiveness.

Another aspect of the present invention provides point-of-use filtered nitrogen, air or inert gases by a multistage filtering system to prevent airborne particles from contaminating wafers. In one embodiment, nitrogen passes through a local filter and into a distribution system located in a cover of a rinse tank. This provides nitrogen blanket over the rinse water to prevent particles in the air from contacting the wafers. The nitrogen blanket can also help retard native oxide formation on the surface of the wafer. Pressurized filtered air or inert gases may also be substituted for nitrogen to reduce contamination.

An aspect of the present invention provides controlled injection of $H_2O_2$ to accelerate native oxide formation in DI water, while ensuring that all previously applied chemicals are removed. Forming the native oxide layer in water makes the wafer surface less attractive to particles than a native oxide layer formed in air. In addition, the controlled injection $H_2O_2$ purge helps control bacteria growth.

An aspect of the present invention provides an auxiliary injector that could be used for injecting a small amount of acids, solvents, surfactants, or special cleaning agents. Such a system provides controlled introduction of additives that enhance the efficacy of the clean and rinse process in some applications, such as pre-diffusion cleans and photoresist removal. This eliminates the need for separate cleaning processes.

An aspect of the present invention provides for optimization and control of fill, flow, cascade rinse, spray and dump cycle times by an automatic and programmable monitoring and control system. The controller is programmed to control all the variable elements such as the DI water flow, the fill time, the dump time, the cascade rinse time, the number of quick dumps, the flow of nitrogen, the injection of hydrogen peroxide, and the use of auxiliary chemicals.

An aspect of the present invention provides for different rinsing modes that can be optimized for different processing applications. For hydrophobic (post-HF) wafers, the rinser is operated in "cascade" or "overflow" mode. Alternatively, partial dumping can be used to lower the DI water level from its maximum level to just above the top of the wafers. The cascade cycle and the partial dump cycle ensure that the wafers can remain submerged under water during the entire rinse cycle.

Another aspect of the present invention prevents bubbles and micro bubbles which can introduce particulate contamination of wafers. This is achieved by using a cylindrical tank design that eliminates corners. In a further feature, a screen can be placed near the point where the DI water enters into the tank to break-up any formed bubbles.

The present invention may significantly reduce particles and defects in wet processing systems at a very affordable cost, so both large and small manufacturers can benefit. It can improve die yields in foundries with average DI water purity.

Another aspect of the present invention may reduce the particle count on wafers from several hundred per wafer to near zero. This is achieved by having point-of-use filters near the rinsing system. This can eliminate or greatly reduces particles that arise from the distribution system.

Another aspect of the present invention may reduce the semiconductor manufacturing time by eliminating a source of wafer defects. By placing the filters near the rinsing wet bench, the number of particles that come from the distribution system can be reduced. Further, local filters allow each wet bench to be maintained on its own schedule without shutting down the entire central water facility. This allows the manufacturer to keep much of the foundry running at all times. This scheduling flexibility allows the manufacturer to pay greater attention to each wet bench's problems as the problems arise, instead of waiting for a systemwide shutdown.

Another aspect of the present invention provides an environmentally safe wafer cleaning method that can reduce foundry operating costs. This is achieved by allowing for the addition of chemicals to the rinse water if desired, eliminating the need for additional chemical tanks. Additionally, the other features in the rinsing system may reduce the wafer particle count to a level that obviates or reduces the need for using cleaning chemicals.

Another aspect of the present invention provides a self-seating dump door in the rinser that does not require additional seals. This is achieved by using a door shaped in the form of a cone or other convex shape.

DETAILED DESCRIPTION OF THE PREFERRED EMBODIMENTS

The following description is the best contemplated mode of carrying out the invention. In the accompanying drawings like numerals designate like parts in the Figures.

Figure 1:
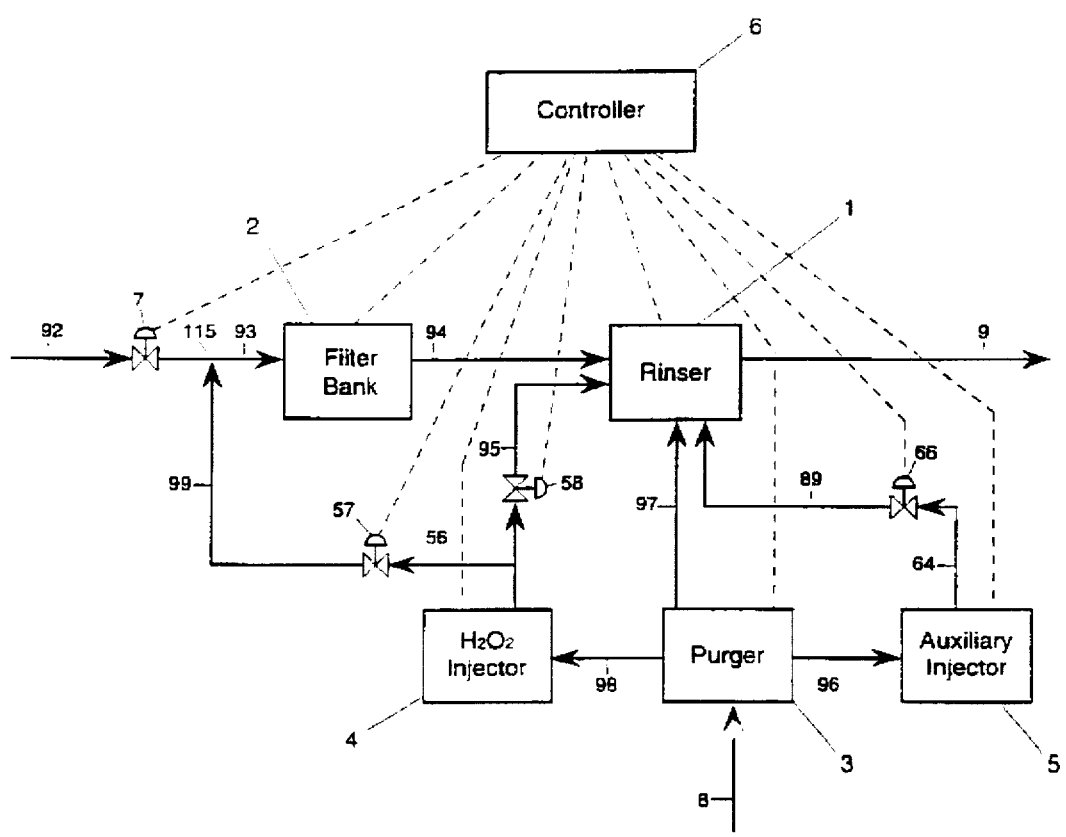
FIG. 1 shows the major elements of an embodiment of the rinsing system.
Figure 2:
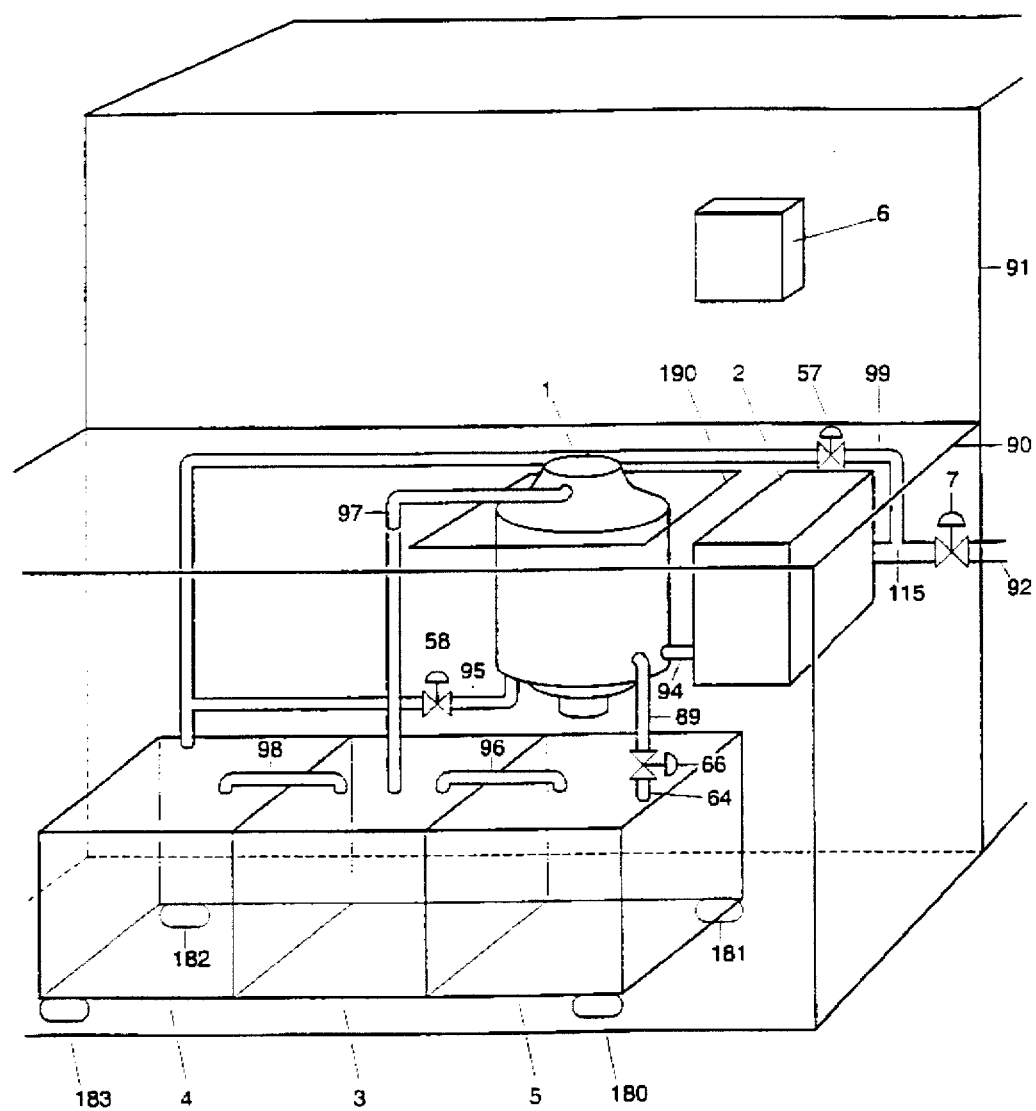
FIG. 2 shows the arrangement of an embodiment of the major system components around a wet bench.

FIGS. 1 and 2 illustrate shows the connections between the major elements of an embodiment of the system. DI water from a central source (not shown) is delivered through a water input pipe 92. The water passes through a system intake valve 7 into a filter bank 2 through a filter pipe 93. The filter bank 2 filters particles out of the DI water. The filtered DI water proceeds into a rinser 1 through a rinser pipe 94. One or more wafers (not shown) are placed in the rinser 1 for rinsing with DI water. The DI water then exits the system for waste water treatment through a waste water pipe 9.

Nitrogen or other gases are delivered from a central supply via a gas input tube 8 to a purger 3. The purger 3 filters the gas to remove particles and provide a reservoir of clean gas to facilitate processing. This produces clean gas for use in other parts of the rinsing system. Clean gas is provided to an auxiliary injector 5 by an auxiliary injector gas tube 96. Clean gas is also provided to an $H_2O_2$ injector 4 by an $H_2O_2$ injection gas supply tube 98. Clean gas is provided to the rinser 1 by a rinser gas supply tube 97. Using a clean gas in the rinser 1 not containing oxygen helps to prevent the formation of a native oxide layer on the surface of the wafers. The controller 6 is a microprocessor based control system that can set the flow of fluids throughout the system. The tubes carrying the gases are made from Teflon tubing such as commonly used in semiconductor foundries for delivery of nitrogen and filtered air.

The $H_2O_2$ injector 4 provides $H_2O_2$ for use in the filter bank 2 and the rinser 1. The $H_2O_2$ can be used for reducing or eliminating any bacteria in the rinser 1 and the filter bank 2 when the system is operated in a cleaning mode. $H_2O_2$ can be injected into the rinser 1 to control native oxide formation on the wafers during the rinsing process. The $H_2O_2$ flows from the $H_2O_2$ injector 4 into the $H_2O_2$ source line 56. The flow of $H_2O_2$ into the $H_2O_2$ filter line 99, and hence into the filter bank 2 can be controlled by the filter valve 57. Similarly, the flow of $H_2O_2$ into the $H_2O_2$ rinser line 95, and hence into the rinser 1 can be controlled by the rinser valve 58. The filter valve 57 and the rinser valve 58 are operated by the controller 6. The $H_2O_2$ can be pumped into the filter bank 2 or the rinser 1 with a pump (not shown) or driven under the pressure of the gas provided by the purger 3. The $H_2O_2$ can enter the filter pipe 93 with a simple T-shaped connection at junction 115. Alternatively, as explained below, a venturi effect injector (not shown) can be placed at the junction 115.

The auxiliary injector 5 contains other chemicals that can be added to the rinse water to clean the wafers, such as conventional acids, solvents, surfactants, or cleaning solutions. The flow of chemicals to the rinser 1 is controlled by the auxiliary chemical valve 66. The chemicals can be driven by gas pressure or pumped into the rinser 1 through an auxiliary chemical source line 64 and an auxiliary chemical line 89.

The controller 6 is a conventional process control computer that programmatically opens and closes the described valves, regulates water and gas flows, and detects when fluids reach certain levels in the rinser 1. A JPC Control Model 971DSB-362 microprocessor controller can be used. JPC Control is located at 102 Compass Point Drive, Suite D, St. Charles, Mo., 63301. In particular, the controller 6 manages the DI water flow rate, the fill time, the dump time, the cascade rinse time, the number of quick dumps, the flow of gas through the system, and the injection of $H_2O_2$, and other additives into the rinse water.

FIG. 2 shows how the system components shown in FIG. 1 can be installed in a wet bench. The rinser 1 sits in a sink partially shown by a sink edge 190. The controller 6 is located in a wet bench head case 91. The filter bank 2 can be located under the wet bench plenum 90. It is desirable that the filter bank 2 is as close to the rinser 1 as practical. Depending on the location of the filter bank 2, the distance can be as short as few inches. The $H_2O_2$ injector 4, the purger 3, and the auxiliary injector 5 are located in cart mounted on casters 180, 181, 182, 183 located below the wet bench plenum 90, or behind the wet bench. This typically might be a distance of several feet. The $H_2O_2$ injector 4, the purger 3, and the auxiliary injector 5 should be located near the rinser 1 and the filter bank 2.

Figure 3:
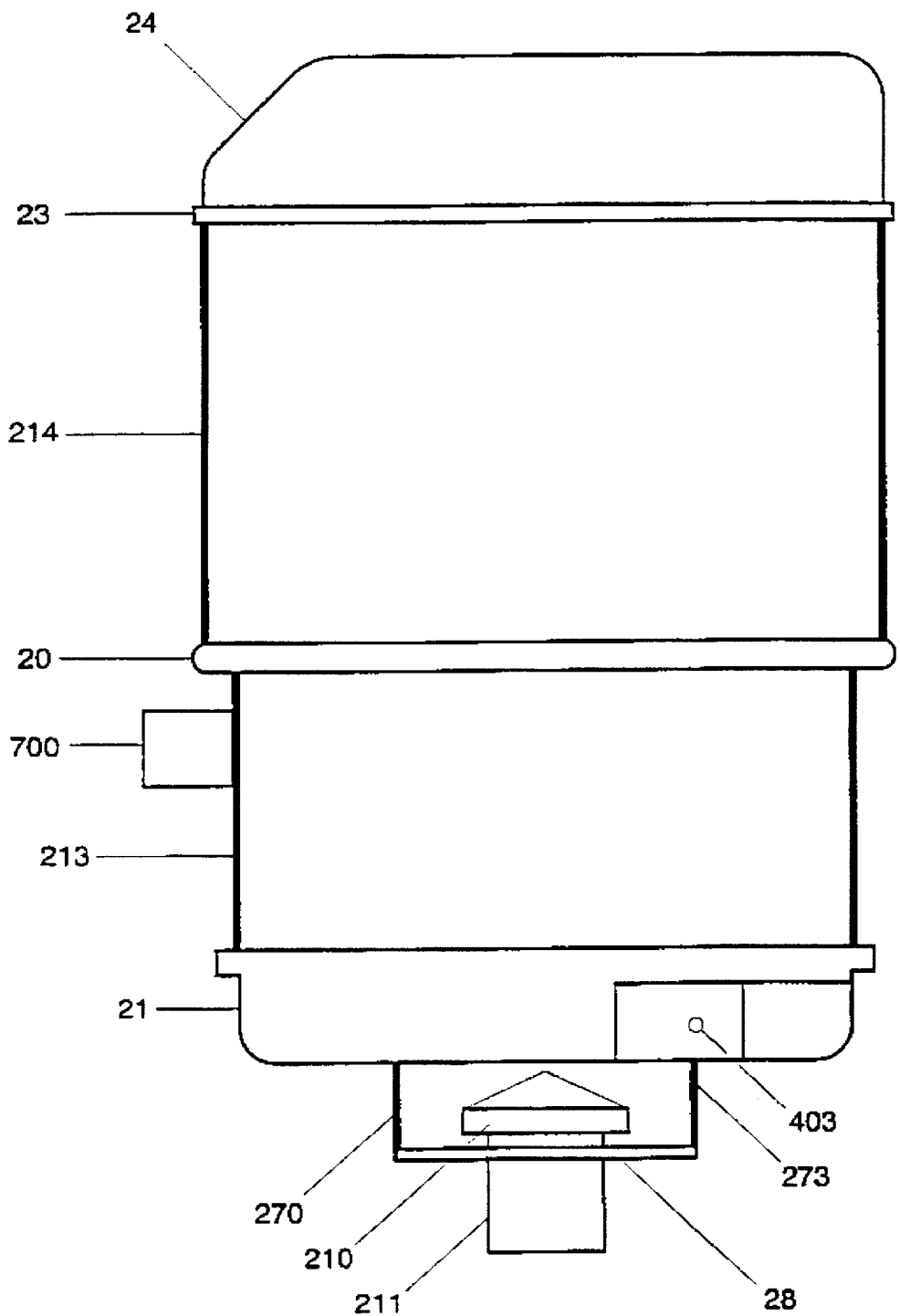
FIG. 3 shows an external right-side view of an embodiment of the rinser.

FIG. 3 shows an external right side view of the rinser 1. The front of the rinser 1 is on the left side of the drawing. The rinser 1 includes a lid 24, a flange 23, an outer barrel 214, a ring 20, an inner barrel 213, and a base 21. The lid 24 pivots on hinges 280 and 281 (FIGS. 6–7) and makes contact with the flange 23. Flange 23 rests on outer barrel 214. Outer barrel 214 rests on the ring 20. Inner barrel 213 rests on base 21. The dump door 210 is mounted on piston 211. Piston 211 is movably connected to the base 21 within the piston mounting plate 28. The piston mounting plate 28 is connected to the base 21 by the piston mounting struts 270, 271, 272 and 273 (Struts 270 and 273 shown in FIG. 3). The dump door 210 is shown in the lowered position. A chemical channel 403 can be connected to the $H_2O_2$ rinser line 95 (FIGS. 1–2) or the auxiliary chemical line 89 (FIGS. 1–2).

Figure 4:
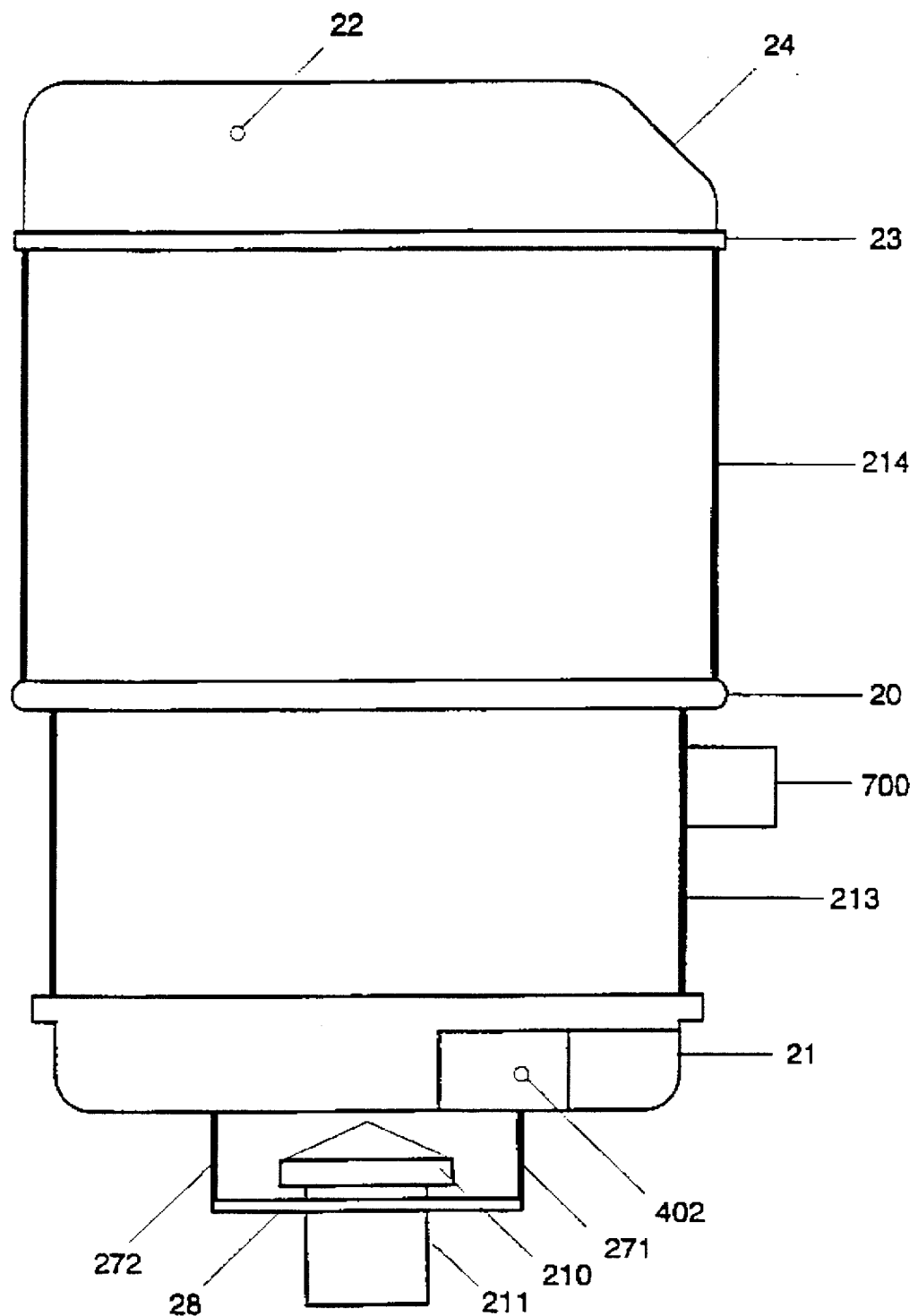
FIG. 4 shows an external left-side view of an embodiment the rinser.

FIG. 4 shows an external left side view of the rinser 1. The rinser gas tube 22 is connected to the rinser gas supply tube 97 (FIGS. 1–2) with a conventional Jaco fitting (not shown). The second chemical channel 402 can be connected to the $H_2O_2$ rinser line 95 (FIGS. 2–3) or auxiliary chemical line 89 (FIGS. 2–3).

Figure 5:
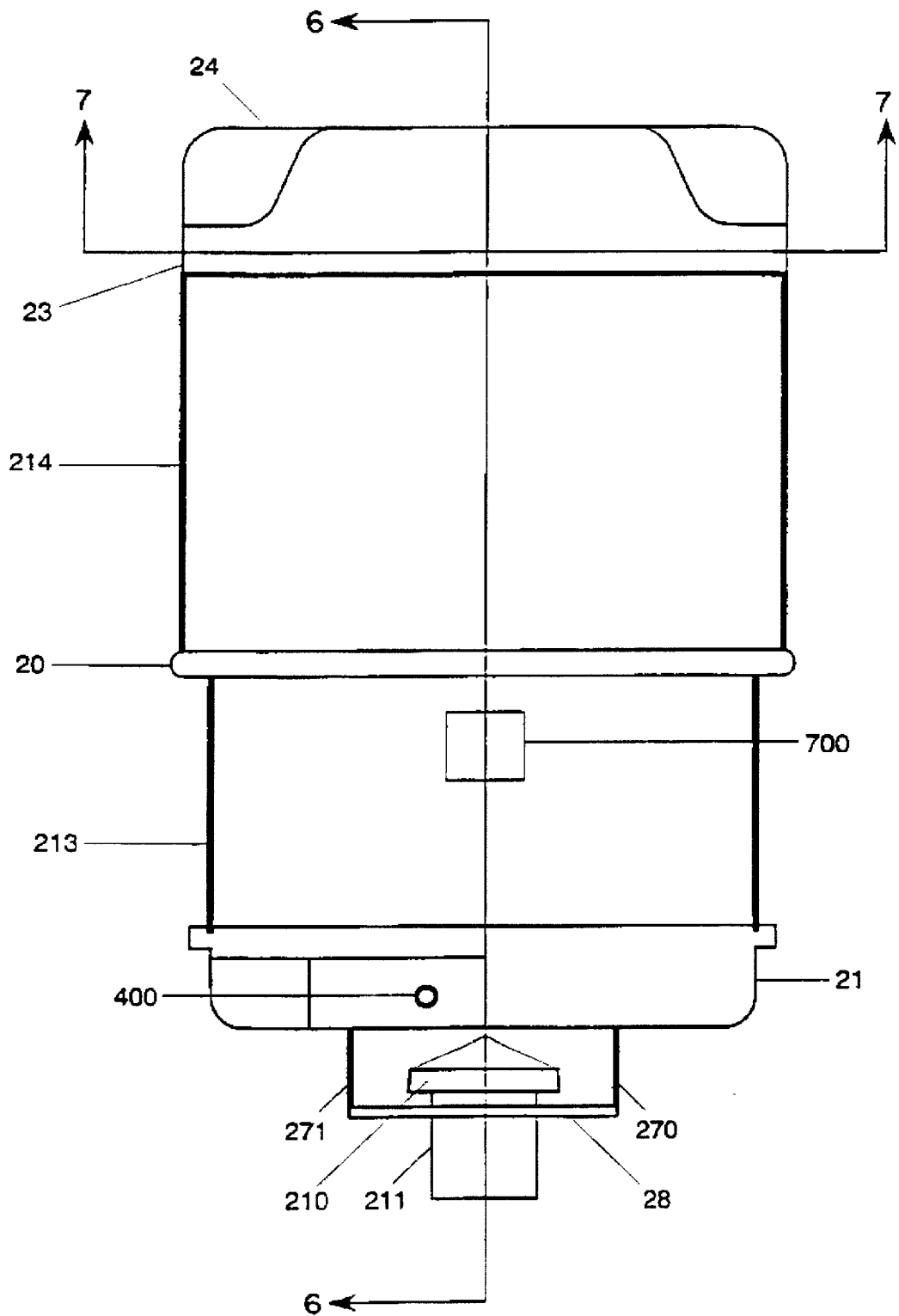
FIG. 5 shows an external front view of an embodiment of the rinser

FIG. 5 shows an external front view of the rinser 1. The rinser pipe 94 (FIGS. 1–2) is connected to the first water channel 400.

Figure 6:
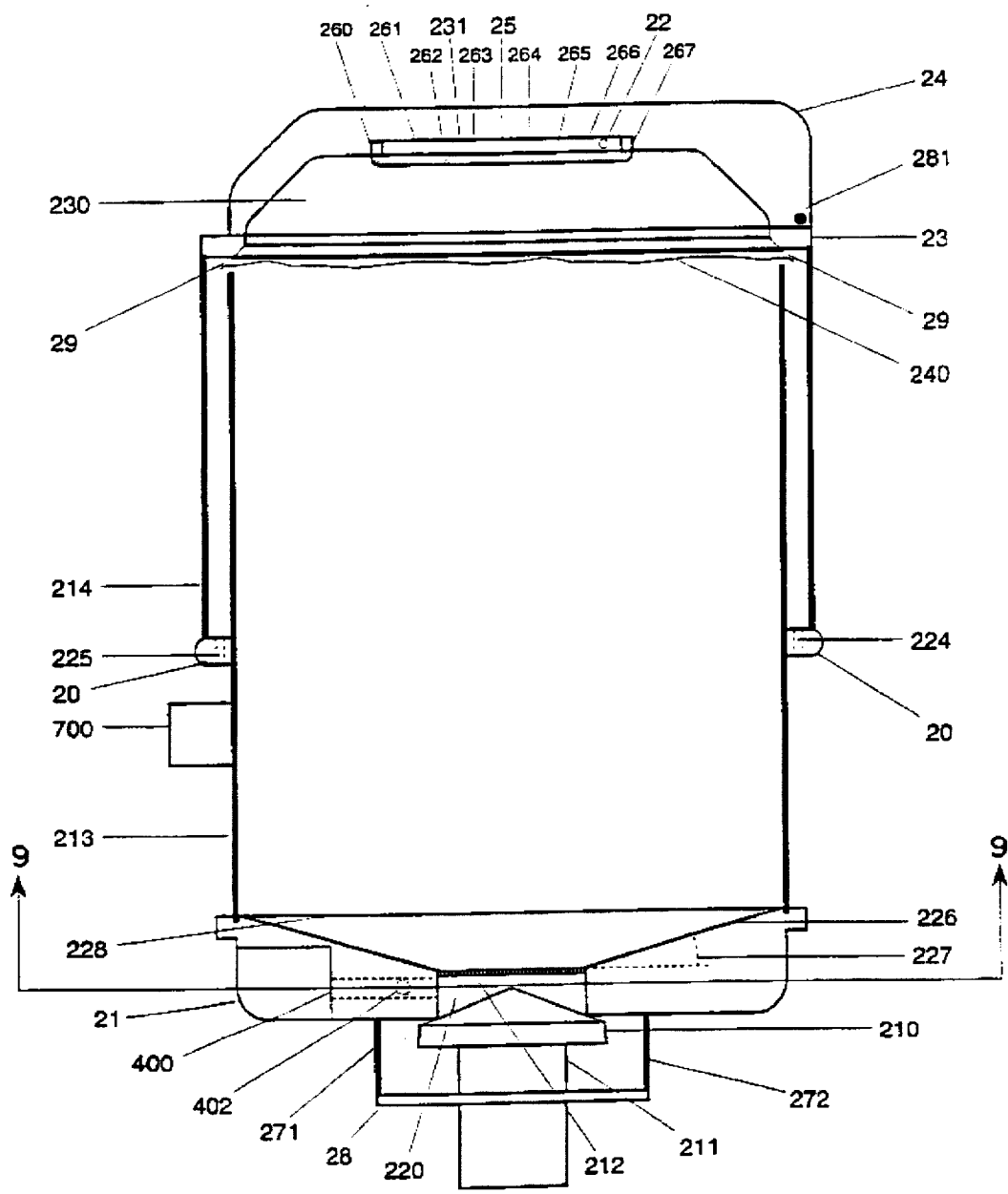
FIG. 6 is a cross-sectional view of an embodiment of the rinser with rinse water present taken along line A—A of FIG. 5.

FIG. 6 shows a cross-sectional view of the rinser 1 taken along line A—A of FIG. 5. Lid 24 is shaped to form a pocket 230 sitting above the rinse water surface 240. Rinse water enters the inner barrel 213 through the first water channel 400. Rinse water can cascade over the top edge of an inner barrel 213 through a gap 29 and through an inter-barrel hole 225 to waste water pipe 9 (FIG. 1). Inter-barrel holes, such as inter-barrel hole 224 and 225, are distributed along the ring 20.

Rinse water leaving through inter-barrel hole 225 can strike a sensor 700. Sensor 700 can be a conventional pH sensor that detects the rinse water acidity or a conventional resistivity monitor that determines the rinse water's electrical resistance. This provides a measure of the level of impurities in the water to the controller 6. The controller 6 can then adjust the operation of the system accordingly.

Piston 211 can also move the dump door 210 down to permit rinse water to escape from the inner barrel 213 through hole 220.

The base 21 and the inner barrel 213 should be shaped to reduce or eliminate sharp edges and corners. Making the inner barrel 213 in the form of a cylinder helps to achieve this goal. Keeping the surfaces exposed to water smooth eliminates places for bacteria to grow and for particles to become trapped. In addition, it helps keep the water flow uniform during rinsing. Turbulent water can form bubbles that can trap contaminants and bring them to the wafer surface. Sloping the base towards the hole breaks bubbles, conserves water, and assists in positioning the wafer boat in the center of the tank, as shown by base slope 226. It is believed that a slope angle 227 of 10 to 30 degrees will work satisfactorily. Base back edge 228 shows the edge where the base 21 meets the inner barrel on the inside of the rinser 1.

The inner barrel 213 should be large enough to contain a wafer boat and most of its handle. In one embodiment, the inner barrel 213 is approximately 12 inches in diameter and about 16 inches in height. Alternatively, the inner barrel 213 could be sized to be large enough to contain only the wafer boat. The operator can remove the handle from the boat, or leave the handle exposed to air. While this saves DI water, the act of removing and reinstalling the handle could introduce particles into the water.

Diffuser 25 distributes the gas provided by the purger 3 uniformly into the pocket 230 and the inner barrel 213. FIG. 6 also shows the relationship between the lid 24, the pocket 230, the diffuser 25, the inner cavity 231, the rinser gas tube 22, and the rinse water surface 240 when the inner barrel 213 is filled with DI water. The gas enters the inner cavity 231 of the diffuser 25 through the lid 24 by the rinser gas tube 22. The gas then enters pocket 230 through the gas holes 260, 261, 262, 263, 264, 265, 266, and 267. This establishes a gas blanket over the surface of the water. The gas can escape through the gap 29 or through any small gaps between the flange 23 and the lid 24. Keeping the gas at a higher pressure than the outside atmosphere helps keep airborne particles from drifting into the inner barrel 213. This eliminates the need for a seal between the flange 23 and the lid 24.

The space between the rinse water surface 240 and the lower surface of the lid 24 should be small to minimize the amount of clean gas required in the rinser 1. The gap 29 should be preferably approximately one-quarter inch to one-half inch. The size of the pocket 230 should be determined by the dimensions of the exposed portion of the handle on the boat wafer.

The controller 6 raises and lowers the piston 211 pneumatically to control the water level in the inner barrel 213. A conventional dump door piston should be satisfactory. At the top of piston 211 is dump door 210. The dump door 210 is shaped in the form of a cone to provide a seal with the edge of hole 220 in base 21 and help channel the rinse water flow upwards into the inner barrel 213. Conventional dump doors are flat and use seals. Seals can be a source of particle contamination and present a maintenance problem. Alternatively, the dump door 210 can have a convex shape.

The mesh 212 sits on top of hole 220 to break up bubbles that may form or be present when rinse water enters the hole 220 through water channel 400. Mesh 212 also smoothes the flow of water into the inner barrel 213. Quarter inch mesh spacing in mesh 212 should be adequate.

Figure 7:
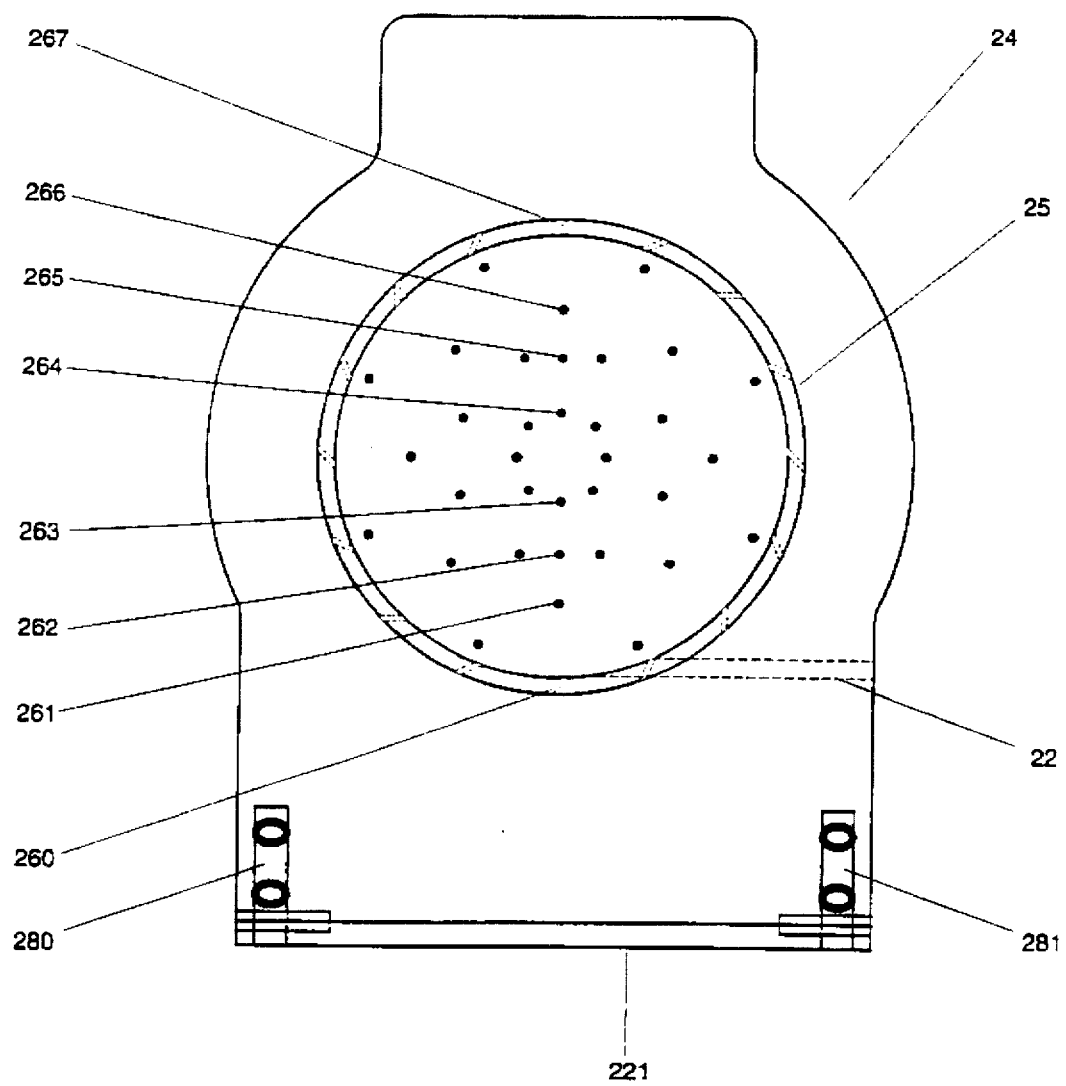
FIG. 7 is a cross-sectional view of the lid of the rinser taken along line B—B of FIG. 5.

FIG. 7 shows a view of the inside of the lid 24. It is viewed from the line B—B of FIG. 5. Diffuser 25 is shown with the gas holes 260, 261, 262, 263, 264, 265, 266, and 267. Similarly displayed dots and dashed lines indicate additional gas holes. The gas holes should be placed to provide a uniform flow of gas into the pocket 230 and the inner barrel 213. Alternate patterns and arrangements of one or more holes are also feasible. The rinser gas tube 22 provides a path for clean gas from the purger 3 to enter the rinser 1 as shown in FIG. 1. The hinges 280 and 281 are conventional and placed as indicated.

Figure 8:
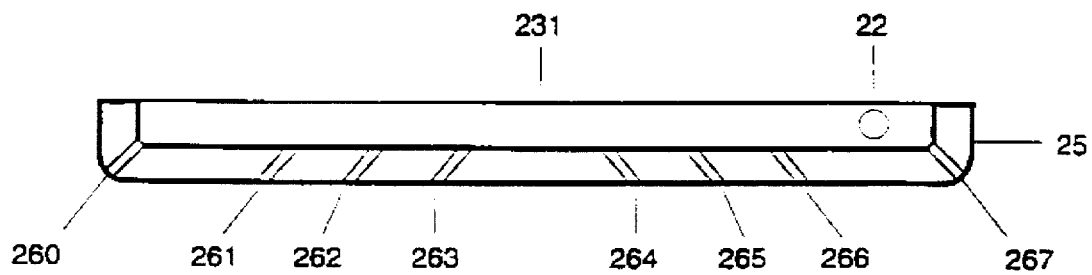
FIG. 8 is a side view of a gas diffuser unit.

FIG. 8 shows a cross-section of diffuser 25 taken along line A—A of FIG. 5. It shows the relationship between the inner cavity 231 and some of the gas holes 260, 261, 262, 263, 264, 265, 266 and 267.

Figure 9:
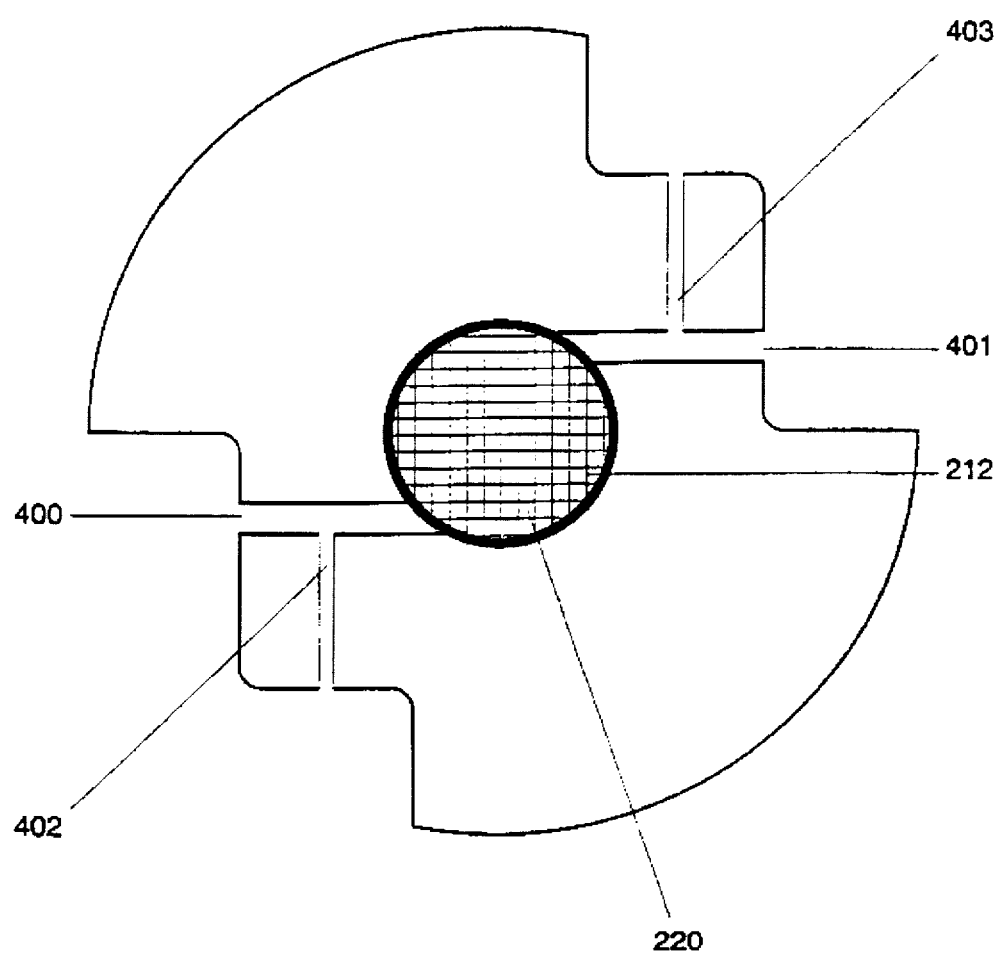
FIG. 9 shows a cross-section of the base of the rinser taken along line C—C of FIG. 6.

FIG. 9 shows a cross-section of the base 21 taken along line C—C of FIG. 6 above the dump door 210 and piston 211. It shows the hole 220, the mesh 212, the first water channel 400 and the second water channel 401. These channels provide a route for DI water to enter the hole 220. In one embodiment, the first chemical channel 402 intersects the first water channel 400, and the second chemical channel 403 intersects the second water channel 401. In other embodiments, the intersecting channels can be constructed to form a venturi effect injector.

Figure 10:
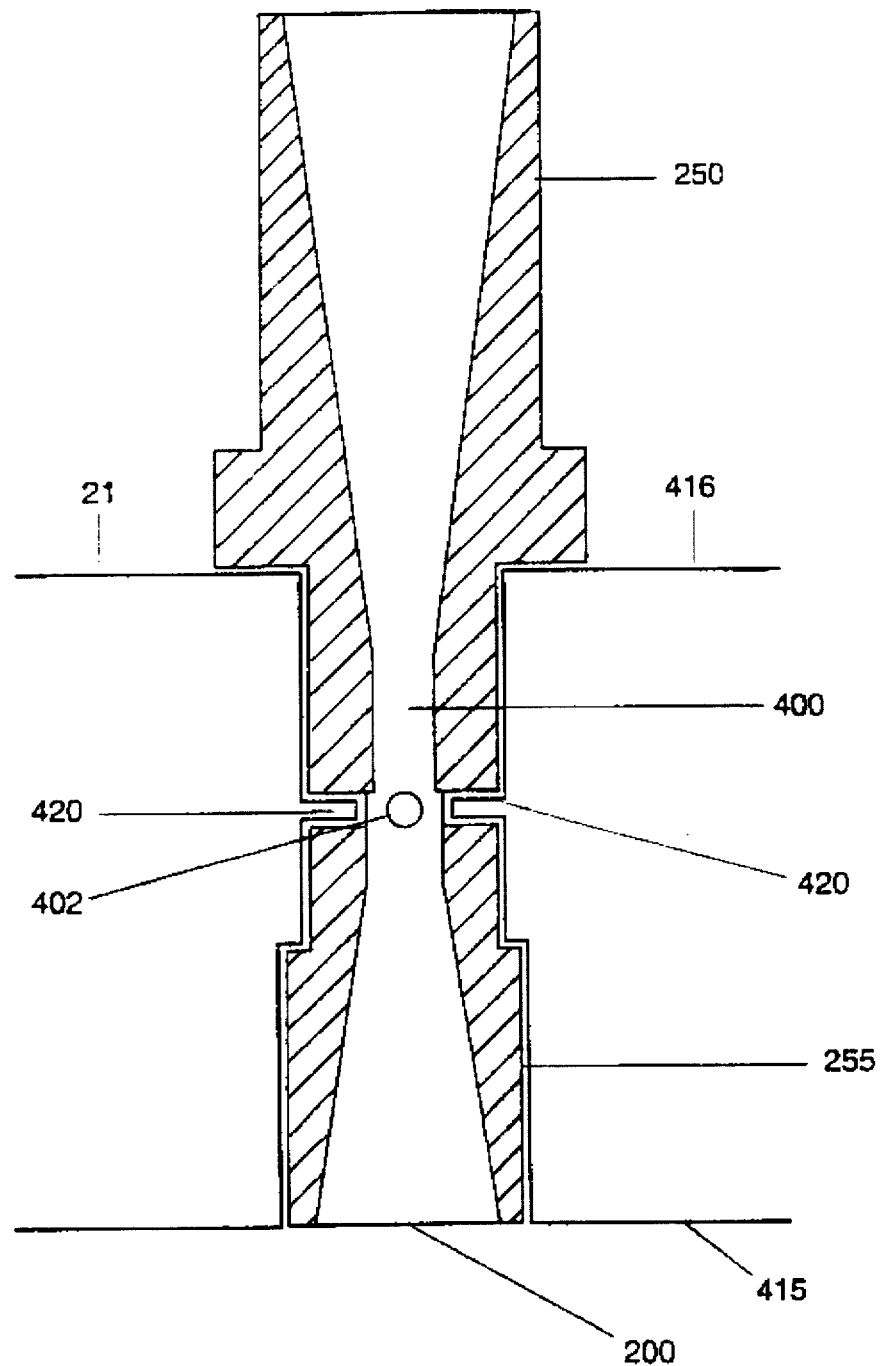
FIG. 10 shows a cross-section of a two piece version of a venturi injector that can be inserted into a water channel.

FIG. 10 shows a cross sectional view of a venturi effect injector for the first water channel 400 (FIG. 9). In this embodiment, the injector is formed by inserting a water input section 250 into the first water channel 400 from the external portion of the base 21 until it contacts the external base wall 416 and the water channel ridge 420. The water output section 255 is inserted into the first water channel 400 until it is flush with the hole wall 415. The hole wall 415 is the portion of the base 21 that forms the cylindrical wall of the hole 220. The water channel ridge 420 is formed as part of the first water channel 400 when the base 21 is constructed. First chemical channel 402 enters the first water channel 400 at the water channel ridge 420. The rinser pipe 94 (FIGS. 1–2) is attached to the water input section 250.

Figure 11:
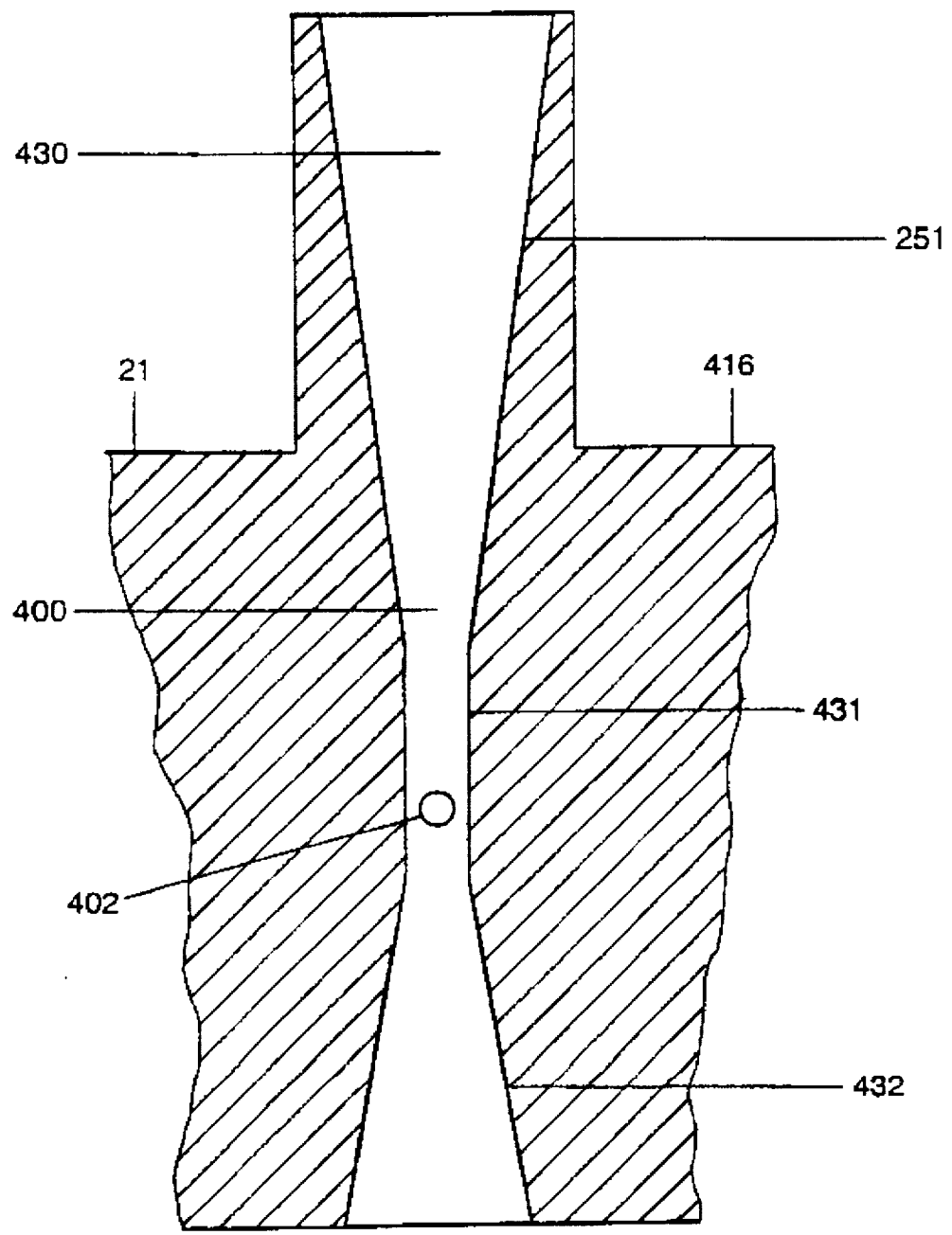
FIG. 11 shows a cross-section of a water channel constructed in the form of a venturi injector.

FIG. 11 shows another embodiment of a venturi effect injector in the first water channel 400. Here, the water channel 400 is shaped to the form shown in FIG. 10 without using separately inserted pieces. The rinser pipe 94 (FIGS. 1–2) can be attached to the formed input section 251.

A venturi effect injector uses the changes in the flow characteristics of one fluid in a channel to draw a second fluid into the same channel. Using the embodiment shown in FIG. 11, DI water flows into the input portion 430 of the first water channel 400. The channel narrows into the central portion 431. To keep the same mass flow rate of DI water, the DI water increases velocity in the central portion 431 of the first channel 400. As the cross-section of channel 400 enlarges to form the output portion 432, the water velocity slows down, and the pressure correspondingly drops. This drop in water pressure draws chemicals out of the first chemical channel 402 into the first water channel 400. Using a venturi effect injector may eliminate the need for a pump for delivery of the chemicals.

The same techniques used for the first water channel 400 can be applied to the second water channel 401. Additionally, in alternate embodiments, one or more water channels can be added to the system. Of course, if there is no need to mix chemicals with water at either location, either the first chemical channel 402 or the second chemical channel 403 or both can be omitted.

The components of the rinser 1 that are in contact with DI water should be made from PVDF. This includes the dump door 210, the base 21, and the inner barrel 213. The other components can be made of PVDF or a plastic such as polypropylene. In one embodiment, the base 21 and inner barrel 213 can be cast as one piece while the flange 23 and the outer barrel 214 are cast as another piece. Alternatively, the base 21 can be cast as one piece. The inner barrel 213 and the outer barrel 214 can be shaped from sheets of PVDF, and attached to the base 21.

Figure 12:
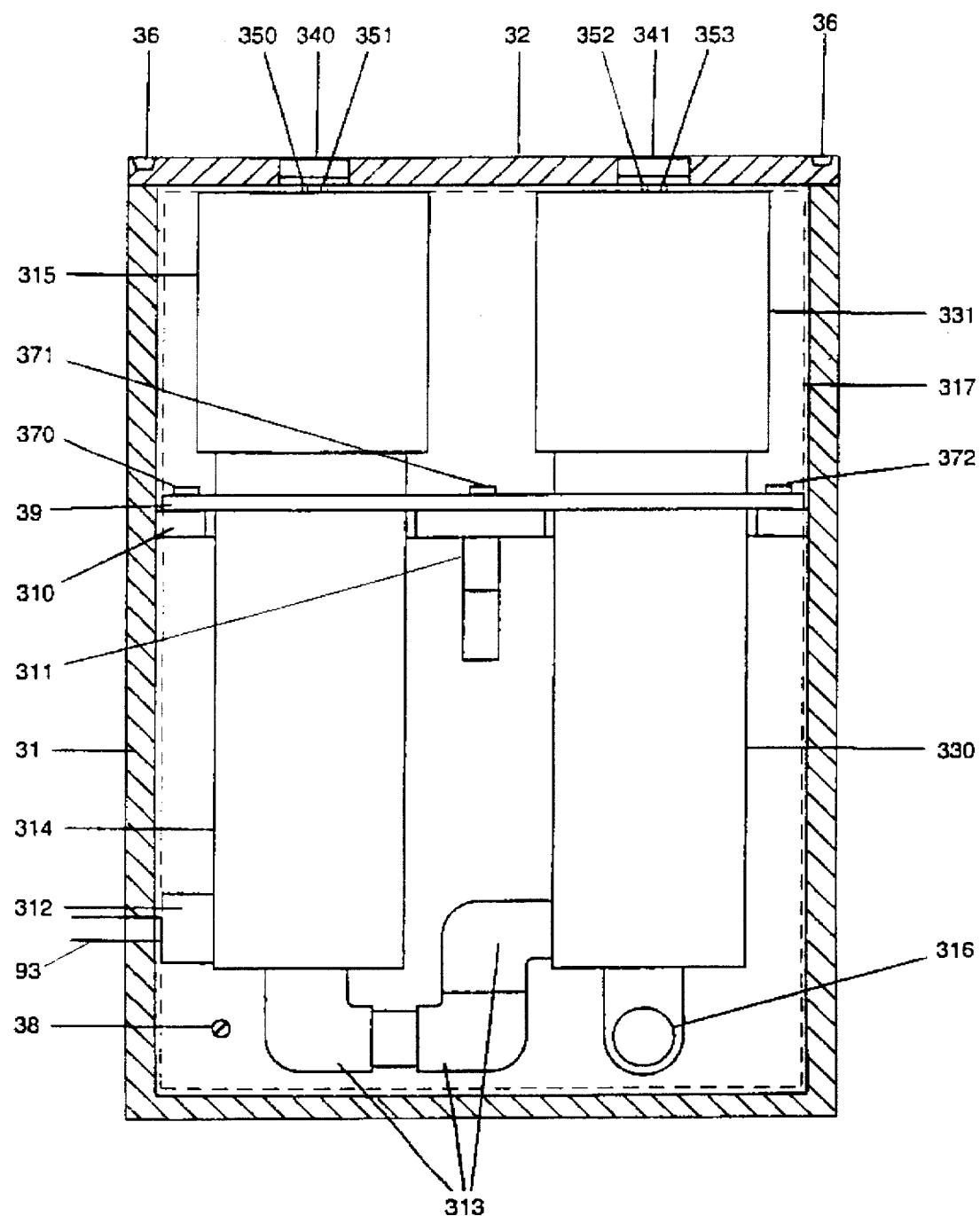
FIG. 12 shows a cross-section of a filter bank.

FIG. 12 shows a cross-section of an embodiment of a filter bank 2. In the embodiment shown, there are two filter housing assemblies. The first filter housing assembly includes a screw-on cap 315, two ventilation plugs 350 and 351, and a filter body 314. The second filter housing assembly is similarly constructed with screw-on cap 331, ventilation plugs 352 and 353 and filter body 330. Each filter housing assembly has a cylindrical shape, and is held in a hole in a filter housing support plate 39. The filter housing support plate 39 is attached to a filter bank casing 31 by several plate attachment bolts 370, 371, and 372 and by base support plate 310 and bracket 311. Other attachment mechanisms can also be used. The filter bank lid 32 is attached to the filter bank casing 31 with screws 36. Alternatively, bolts can be used, or the filter bank lid 32 can be sealed to the filter bank casing 31. A casing plug 340 provides access to the first filter housing assembly's ventilation plugs 350 and 351. Another casing plug 341 provides access to the second filter housing assembly's ventilation plugs 352 and 353. The casing plugs 340, 341 and the ventilation plugs 350, 351, 352 and 353 can be removed to allow a removable needle valve (not shown) to be inserted into each filter housing assembly. The needle valve provides a mechanism for removing air from the filter housing assembly when the filter bank 2 is deployed in a wet bench. The ventilation plugs 350, 351, 352, and 353 and the casing plugs 340, 341 are sized to fit the needle valve. An example of an appropriate needle valve is Galtek Needle Valve part number 204-30.

DI water comes into the filter bank 2 from the filter pipe 93 by a water inlet 312. The water flows through the first filter housing assembly and into the inter-stage pipe 313. The DI water then passes through the second filter housing assembly to the outlet coupling 316. The rinser pipe 94 (FIGS. 1–2) is connected to the outlet coupling 316.

Figure 13:
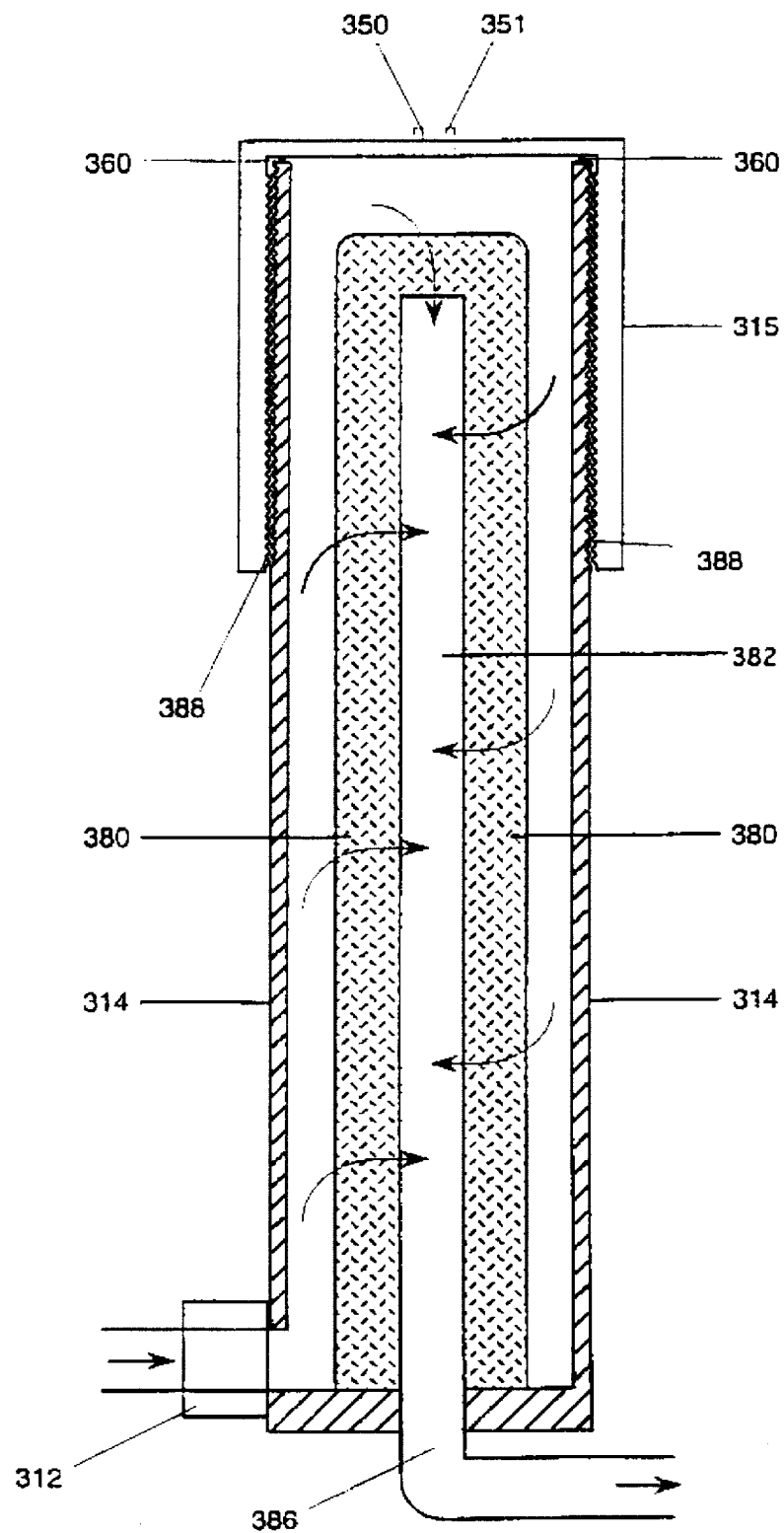
FIG. 13 shows a cross-section of a filter assembly housing containing a filter.
Figure 14:
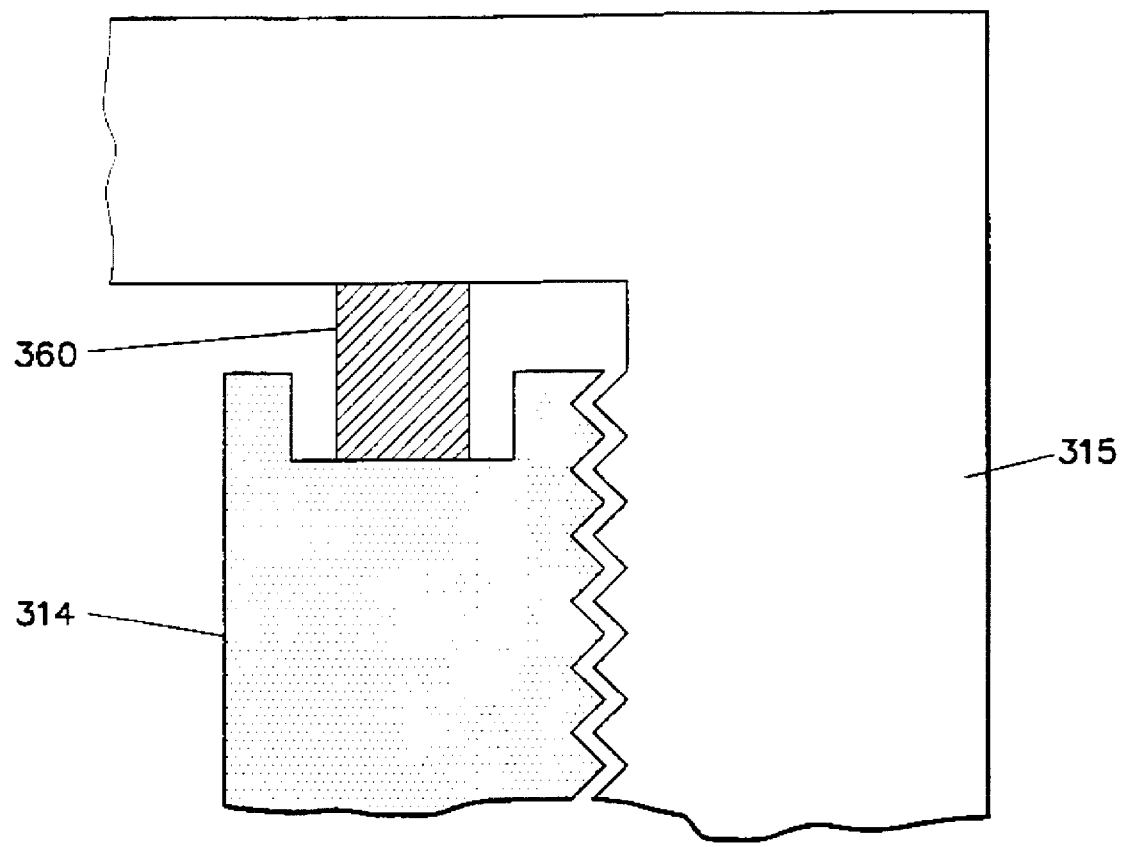
FIG. 14 shows a cross-section of the assembly seal, the screw-on cap and the filter body.

FIG. 13 shows a cross-sectional view along the centerline of the first filter housing assembly with a commercial filter inserted. The screw-on cap 315 is attached to the filter body 314 by the threads 388. DI water enters through the water inlet 312 and circulates around a filter 380. The DI water passes through the filter 380 to an inner core 382 as indicated by the arrows. The DI water leaves the inner core 382 through water outlet 386. The assembly seal 360 prevents DI water from seeping out and particles from entering. In one embodiment, the assembly seal 360 can be a Kalrez brand seal from Dupont. FIG. 14 shows a close-up view of the assembly seal 360 between the filter body 314 and screw-on cap 315.

The second filter housing assembly has the same structure as the first assembly. The dimensions of each filter housing assembly and the dimensions of connecting pipes should be adjusted to correspond to the dimensions of the filter 380.

One embodiment of the filter bank 2 uses a 0.2 micron positive charge filter, such as model number AB1NA3ZE from Pall Ultrafine Filtration Company, in the first filter housing assembly, and a 0.1 micron positive charge filter, such as Pall model number AB1NI3ZE in the second filter housing assembly. Appropriate filters can be found from Pall Ultrafine Filtration Company, Electronics Filter Group, 2200 Northern Boulevard, East Hills, N.Y. 11548-1289. An alternate embodiment would use a negatively charged filter as a second stage filter.

Many particles found in DI water are negatively charged. Therefore, using a positive charge filter traps many particles, including particles that are smaller than the filter's rated size. Using an uncharged or a negative filter as a second stage eliminates many of the remaining particles. This filter combination is especially effective in trapping the particles. This combination of filters results in effective particle reduction with only a minimal pressure drop.

The filters in each filter housing assembly can use electrical charge to capture particles. To prevent the inadvertent release of particles due to an electrical discharge nearby, the inside of filter bank casing 31 and filter bank lid 32 referred to in FIG. 12 have a conducting shield 317 and grounding terminal 38 to enclose the filter housing assemblies in a Faraday cage. The conducting shield 317 can be composed of stainless steel or aluminum.

In one embodiment, the filter bodies 314, 330 and the screw-on caps 315, 331, the water inlet 312, the inter-stage pipe 313, and the outlet coupling 316 are composed of PVDF. The components are joined together with conventional, high-quality plastic welding techniques. In another embodiment, the filter bank casing 31 and the filter bank lid 32 can be made from polypropylene, and assembled using conventional high-quality plastic welding techniques.

Figure 15:
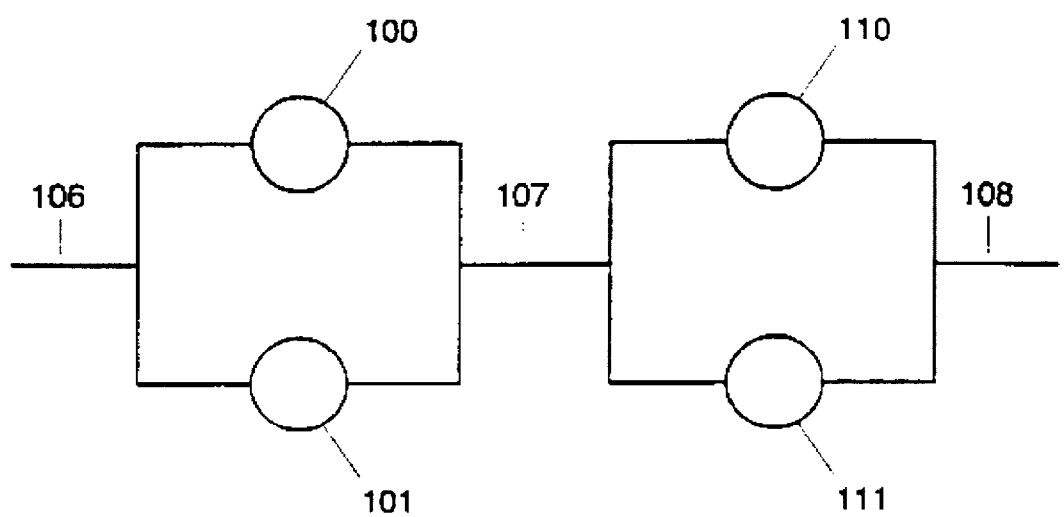
FIG. 15 shows the structure of a bank of filters.

FIG. 15 shows how a bank of filters can be connected together to reduce the time between filter changes. Filters in use eventually become clogged. The time it takes to clog a filter is related to the amount of water that flows through the filter. A fluid enters from a primary fluid input 106 to the positive filters 100, 101. Positive filters 100, 101 can be connected in parallel to form a single positive filter. The fluid then flows through an intermediate connection 107 to the uncharged or negative filters 110, 111. The filters 110, 111 can be also connected in parallel to form a single filter. Using multiple filters in this way extends individual filter life because only part of the total volume flows through a single filter.

Figure 16:
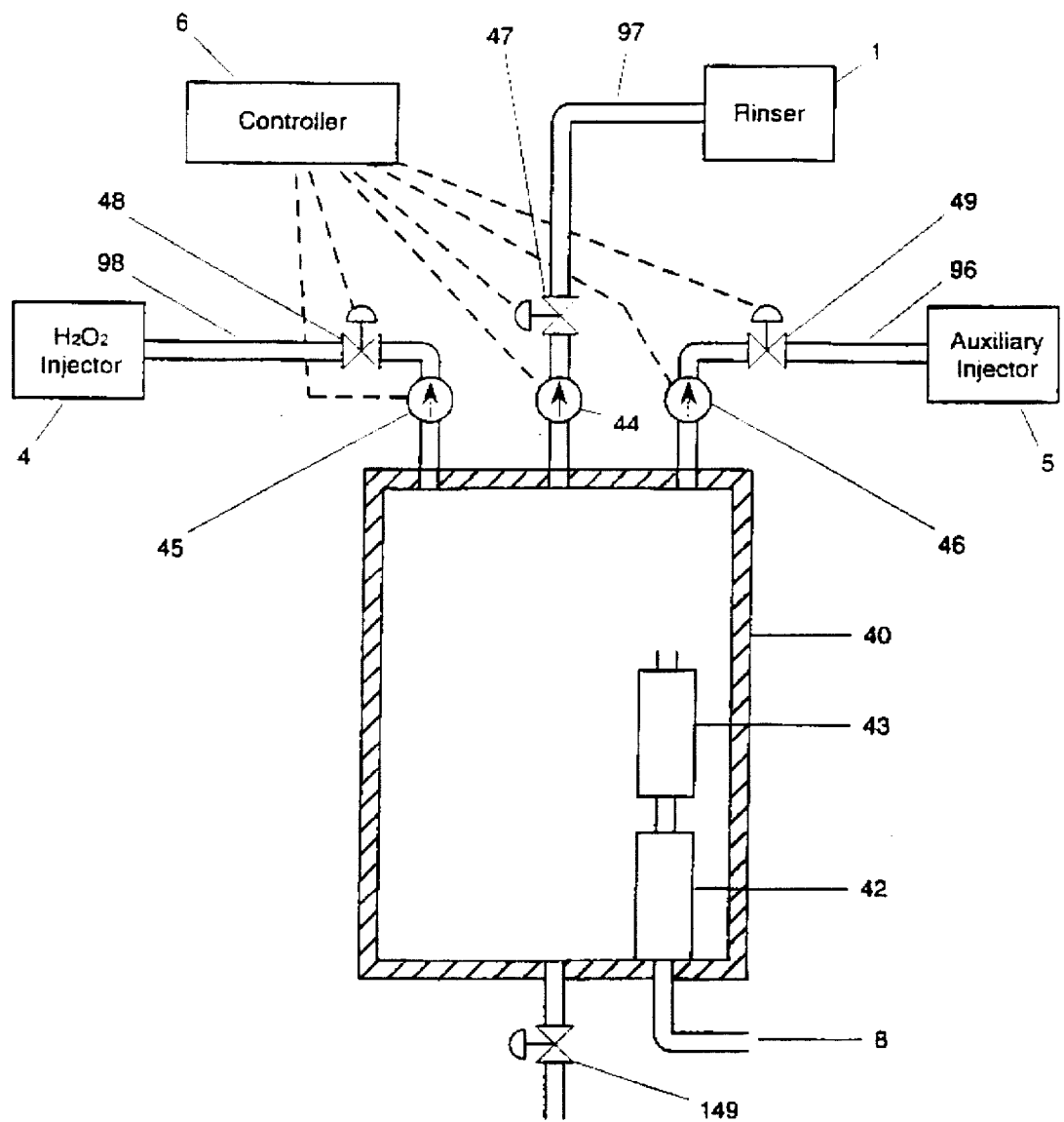
FIG. 16 shows the structure of a purger.

FIG. 16 shows the purger 3. Gas from an external source enters a first gas filter 42 and a second gas filter 43 through the gas input tube 8. The filtered gas then fills a gas tank 40. Millipore filter no. WGFG01HB1 has been found to be effective. It is 3" by 2" filter with a ¼" NPTM. It has a removal rating of 0.003 microns. Other gas filters could also be substituted. Additional gas filters can also be used. The preferred gas used for this purpose is nitrogen which is readily available and inexpensive. Alternately, other gases can be used. For some applications in which wafer oxidation is desirable, filtered air may be substituted.

The flow of gas to the rinser 1 is regulated by the controller 6 using the rinser gas valve 47 and the rinser flow meter 44. The flow of gas to the $H_2O_2$ injector 4 is regulated by the controller 6 using the $H_2O_2$ gas valve 48 and the $H_2O_2$ flow meter 45. The flow of gas to the auxiliary injector 5 is regulated by the controller 6 using the auxiliary injector gas valve 49 and the auxiliary injector flow meter 46. In one embodiment, the flow meter and the gas valve can be combined in a single device. An example of such a device is part no. VFA-22-55V by Dwyer. The gas tank 40 has a relief valve 149 that will release gas from the tank if the pressure in the tank 40 becomes too great. A conventional relief valve can be used. The gas input tube 8 has a conventional regulator (not shown) to prevent backflow.

The filtered gas in the gas tank 40 is used to fill the portion of the inner barrel 213 not filled with DI water. In FIG. 6, if rinse water in the rinser 1 is quickly removed from the inner barrel 213, then the purger 3 needs to provide the equivalent volume of filtered gas quickly. If rinse water is cascaded through the gap 29, then the purger 3 needs to replace the gas less quickly. In addition, the filtered gas in the gas tank 40 can be used to displace $H_2O_2$ in the $H_2O_2$ injector 4 and to displace the chemical in the auxiliary injector 5 as described below.

In one embodiment, the gas tank 40 may be made of polypropylene. Before completely sealing the gas tank 40, the first gas filter 42, and the second gas filter 43 are placed in the gas tank 40. The sides can be attached to each other using conventional, high-quality plastic welding techniques.

The auxiliary injector gas tube 96 is attached to the auxiliary injector 5 and to the auxiliary injector gas valve 49 with conventional Jaco fittings. The rinser gas supply tube 97 is attached to the rinser 1 and to the rinser gas valve 47 with conventional Jaco fittings. The $H_2O_2$ Injection gas supply tube 98 is attached to the $H_2O_2$ injector 4 and to the $H_2O_2$ gas valve 48 with conventional Jaco fittings.

Figure 17:
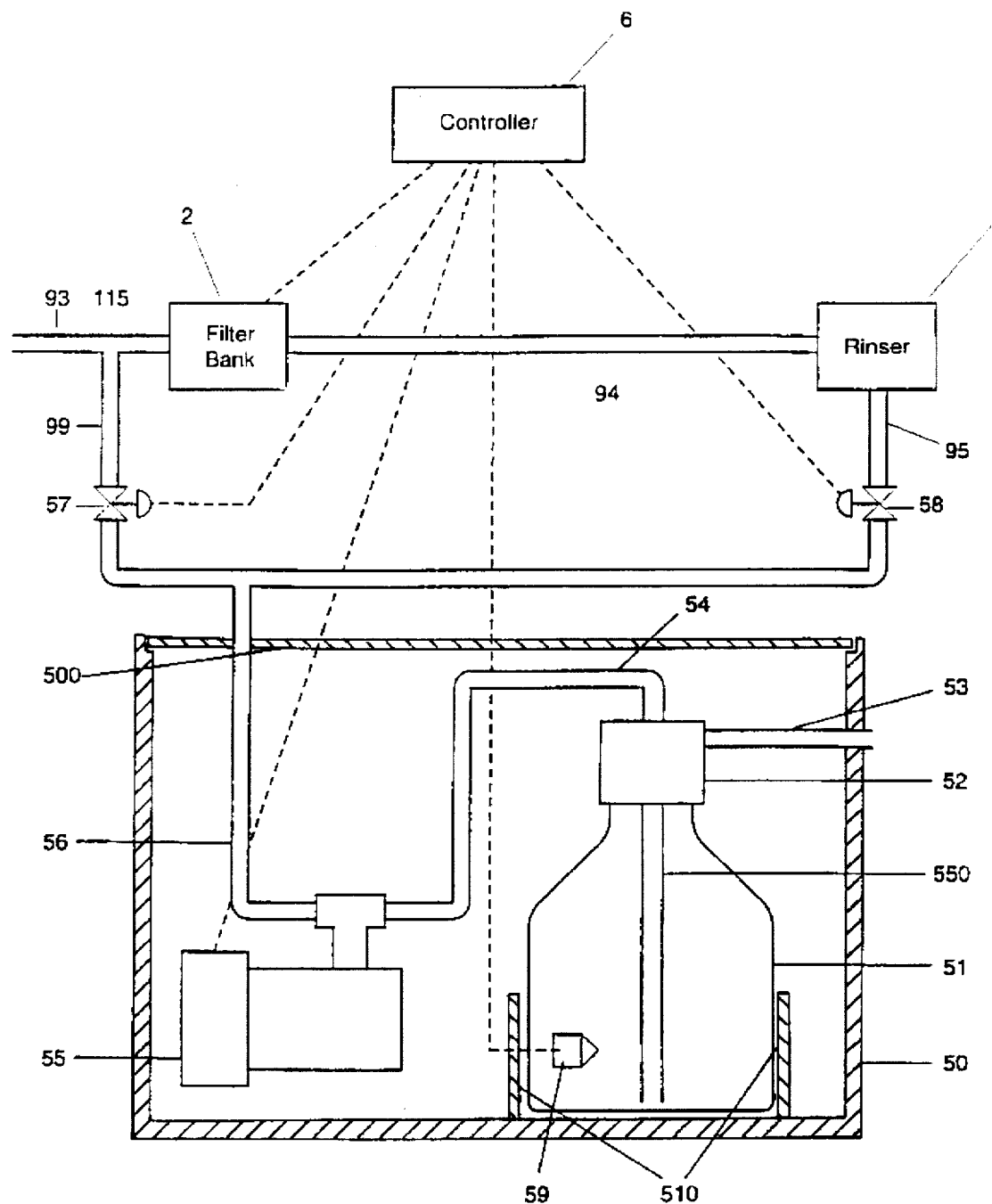
FIG. 17 shows the structure of an $H_2O_2$ injector.

The $H_2O_2$ injector 4 is shown in FIG. 17. It contains an $H_2O_2$ bottle 51 of $H_2O_2$ supplied by the manufacturer of the $H_2O_2$ secured in an $H_2O_2$ injector casing 50 by an $H_2O_2$ bottle holding rack 510. An $H_2O_2$ liquid level sensor 59 attached to the $H_2O_2$ bottle holding rack 510 provides an indication of fluid level in the $H_2O_2$ bottle 51 to the controller 6. Conventional liquid level sensors should be sufficient. Clean gas from the purger 3 enters the $H_2O_2$ injector casing 50 through an $H_2O_2$ injector gas tube 53 and enters the bottle cap 52 to provide a clean atmosphere above the surface of the fluid in the $H_2O_2$ bottle 51. The fluid can be removed from the $H_2O_2$ bottle 51 by a pump 55 through a pump input line 54 and a bottle line 550. A pump that is suitable for the this kind of application is model QC216 by Fluid Metering Inc., 29 Orchard Street, Box 179, Oyster Bay, N.Y. 11771. The immersed end of the bottle line 550 should be placed near the bottom of the $H_2O_2$ bottle 51. The pump 55 is operated by the controller 6.

The pump 55 pushes $H_2O_2$ through an $H_2O_2$ source line 56 to the filter valve 57 and to the rinser valve 58. This permits the introduction of $H_2O_2$ into the filter bank 2 and the rinser 1 for cleaning. Additionally, introducing $H_2O_2$ into the rinser 1 can enhance the formation of oxide on the wafer surface by providing a source of oxygen. Locally introducing the oxygen into the rinse water allows the foundry to reduce the dissolved oxygen in the entire DI water distribution system while obtaining the advantages of forming a native oxide layer on the wafer under water.

Alternately, the $H_2O_2$ can be drawn into the DI water with a venturi effect injector as was explained in the text accompanying FIG. 10. A venturi effect injector can be also used at the junction 115 shown in FIG. 1. Alternatively, instead of using the pump 55 depicted in FIG. 17, $H_2O_2$ can be injected into the system using the pressure of the gas from the purger 3.

The pump input line 54, the $H_2O_2$ source line 56 and the $H_2O_2$ bottle line 550 are constructed of Teflon. The $H_2O_2$ injector gas tube 53 can be of Teflon conventionally used in foundries for gas lines. Other suitable materials could be used.

The bottle cap 52 is sized to fit industry standard bottles for chemical supplies. It is shown in greater detail in FIG. 18. The bottle cap 52 includes a cap housing 520 with a threaded fluid hole 527 and a threaded gas hole 528. An end of the pump input line 54 is threaded and secured into the cap housing 520 by the outer fluid nut 521. The bottle line 550 is threaded and secured to the cap housing 520 by the inner fluid nut 522. The $H_2O_2$ injector gas tube 53 is secured into the cap housing 520 by the gas nut 523. The nuts 521, 522, 523 and the cap housing 520 can be made from PVDF.

Figure 18:
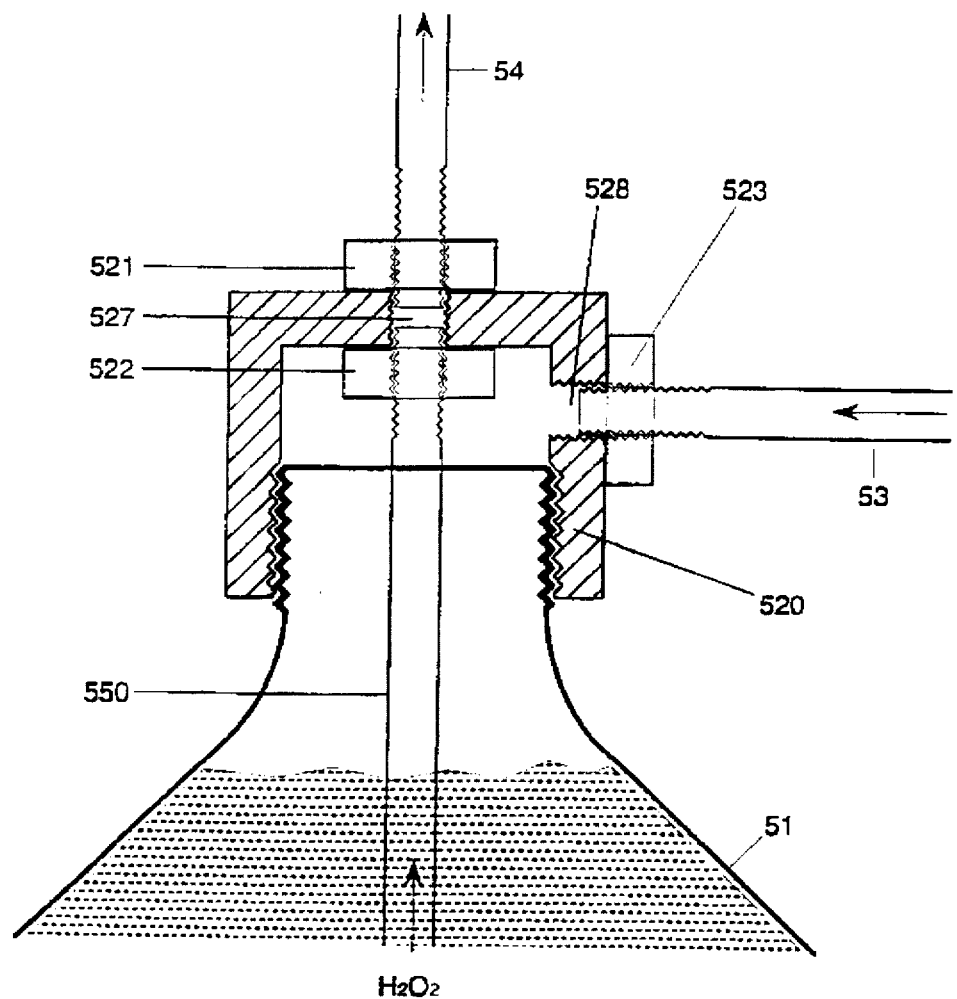
FIG. 18 shows the structure of a chemical storage container cap.

Using the bottle cap 52 shown in FIG. 18 provides several advantages. It allows the $H_2O_2$ manufacturer's bottle to be used directly in the system instead of transferring the $H_2O_2$ from the manufacturer's bottle to another storage container. This eliminates a source of contaminants. Using filtered gas as an atmosphere over the surface of the $H_2O_2$ eliminates a source of contaminants and, depending on the gas, may also reduce chemical interactions that destroy the effectiveness of the $H_2O_2$. In addition, pressurized gas may also be sufficient to force the $H_2O_2$ into the DI water.

Figure 19:
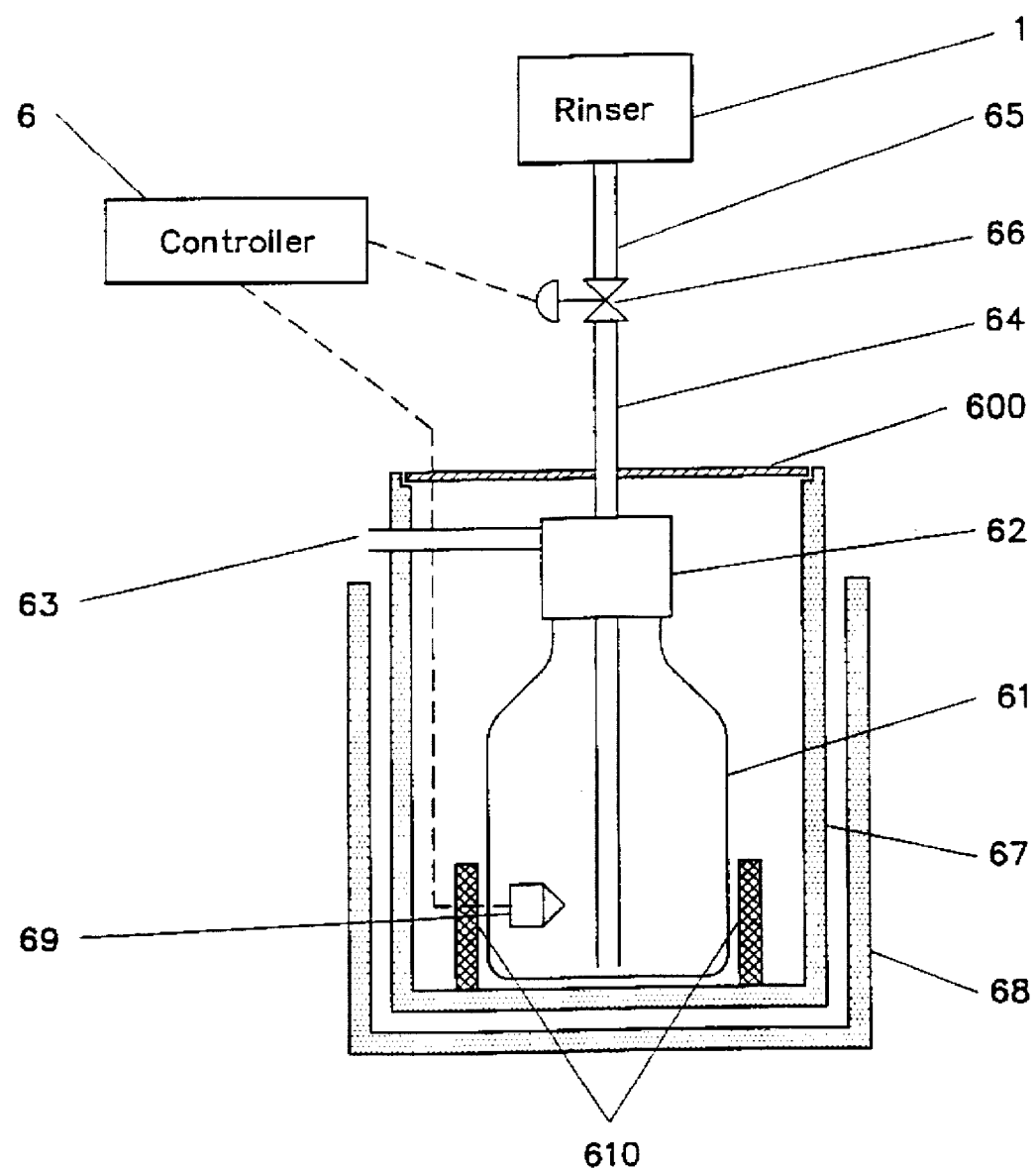
FIG. 19 shows the structure of an auxiliary injector.

The wafer cleaning action in a rinsing system can be enhanced by use of conventional acids, solvents, surfactants or cleaning solutions. The auxiliary injector 5 shown in FIG. 19 can add these additives under the control of the controller 6. The auxiliary injector 5 includes a chemical bottle 61, which is typically a bottle supplied by the chemical manufacturer, secured in the auxiliary injector casing 67 by an auxiliary injector rack 610. The chemical bottle 61 has a dispenser cap 62 which is structurally similar to the bottle cap 52 used in the $H_2O_2$ injector 4. The dimensions of the dispenser cap 62 are determined by the container provided by the manufacturer. Clean gas from the purger 3 can provide a clean atmosphere above the chemical surface, using the same techniques used in the $H_2O_2$ injector 4. The auxiliary injector gas tube 96 (FIGS. 1–2) is connected to the auxiliary chemical injector gas tube 63 with a conventional Jaco fitting.

The pressure to draw fluid out of the chemical bottle 61 can come from a venturi effect injector in a water channel 400, 401 (FIG. 9) in the rinser 1 or it can come from the gas provided by the purger 3. Alternatively, a pump could be used. The auxiliary chemical valve 66, operated by the controller 6, allows the chemical in the chemical bottle 61 to flow into the rinser 1.

An auxiliary chemical level sensor 69 provides indication of low liquid level. An auxiliary injector lid 600 provides access to the chemical bottle 61.

Because the chemical used in the chemical bottle 61 can be hazardous, a double containment system is used by having an auxiliary injector secondary casing 68 surround the auxiliary injector casing 67. The auxiliary injector casing 67 and the auxiliary injector secondary casing 68 can be made from polypropylene, and constructed using conventional, high quality plastic welding techniques.

Operations

The system has different operating modes. The rinse mode uses the system to rinse wafers. The cleaning mode involves purging the system with $H_2O_2$. The filter installation mode, is used to install a new filter bank 2 into the system when the filters in the filter bank 2 have reached the end of their service life.

The rinse mode begins with the system filled with moving DI water. As shown in FIG. 6, DI water in the inner barrel 213 cascades through the gap 29. An operator, typically a human, but possibly a robot, with a boat of wafers, opens the lid 24, places the boat into the inner barrel 213, closes the lid 24, and activates the controller 6 by pressing a button on the front panel of the controller 6. The controller 6 then operates a programmed rinse cycle derived from the needs of the particular application.

Upon activation, the controller 6 would open the rinser gas valve 47 and observe the rinser flow meter 44. The flowing gas would cover the surface of the cascading rinse water with a gas blanket. Typically, that gas would be nitrogen, but, depending on the application, other gases could be used.

One part of a rinse cycle may involve having DI water continue to cascade over the inner barrel 213 until an acid or chemical applied during the previous chemical processing step is washed off of the wafer. The controller 6 can determine if the acid is removed by reading a sensor 700 shown in FIG. 6.

If native oxide formation is desirable, $H_2O_2$ can be introduced into the DI water. If the $H_2O_2$ injector 4 uses a pump, then the controller 6 activates the pump 55, and opens the rinser valve 58. The controller 6 may also need to change the flow of gas from the purger 3 by adjusting the $H_2O_2$ gas valve 48. The $H_2O_2$ injector 4 can be also used without a pump. In this embodiment, the controller 6 opens the rinser valve 58 and adjusts the flow of gas from the purger 3 through the $H_2O_2$ gas valve 48 by observing the $H_2O_2$ flow meter 45. The $H_2O_2$ can be also introduced into the DI water by use of a venturi effect injector in water channels 400 or 401.

The controller 6 can adjust the flow of chemicals into the rinser 1 from the auxiliary injector 5 by controlling the auxiliary chemical valve 66, the auxiliary injector gas valve 49, and observing the auxiliary injector flow meter 46. When the rinser 1 has a venturi effect injector in water channels 400 or 401, the venturi effect will draw the chemical from the auxiliary dispenser unit 61.

In addition to cascade rinsing, the system can support quick dumping rinsing. This can be achieved by the controller 6 activating the piston 211 to lower dump door 210. The water flows through the hole 220 to the waste water pipe 9. The controller 6 can control the fluid level drop by controlling the time that the dump door 210 remains open. The controller 6 could also control the dump rate by controlling the height that dump door 210 drops. Some applications may be best served by removing all of the water, but other applications may work best if the wafers are left covered with water. When quickly dumping the water in the inner barrel 213, the controller 6 should also increase the flow of gas from the purger 3 by opening rinser gas valve 47. This will allow the clean gas from the purger 3 to fill the space left by the evacuating water. Otherwise, contaminated air from outside of the rinser 1 may seep in. Maintaining positive pressure with a clean gas during quick dumps reduces the possibility of airborne contaminants. If the gas lacks oxygen, then maintaining positive pressure helps prevent oxide formation. After cycling with quick dumps and cascade rinses, the lid 24 is opened and the wafer boat is removed.

Occasionally, it may be useful to purge the system with $H_2O_2$, and flush with DI water to eliminate or reduce any bacteria growing in the system. The operator begins the cleaning mode by pushing a button on the front panel of the controller 6. The controller 6 can then inject $H_2O_2$ much as was done in the operating mode, except that instead of opening the rinser valve 58, the controller 6 can open the filter valve 57. DI water from the filter pipe 93 will then carry the $H_2O_2$ through the filter bank 2 and the rinser 1. After some programmatically set time, the controller 6 can close the filter valve 57, and continue flushing with water. This mode permits one bench in the foundry to be purged without stopping production in the rest of the foundry.

In filter installation mode, the entire filter bank 2 is removed and replaced. The controller 6 turns off the DI water at the system intake valve 7. The filter bank 2 is disconnected from the filter pipe 93 and from the rinser 1. A new filter bank is installed by connecting it to the filter pipe 93 and to the rinser 1. Casing plugs 340, 341 and ventilation plugs 350, 351, 352, 353 are removed and needle valves are inserted and opened. The controller 6 turns on the DI water at system intake valve 7 to refill the system with DI water. The inserted needle valves allow for the escape of most of the air trapped in the filter bank 2 during installation. After the air is removed, the needle valves are removed and the casing plugs 340, 341 and ventilation plugs 350, 351, 352, 353 are reinstalled.

The filters within a filter housing assembly can be replaced by removing the filter bank lid 32, and by unscrewing the screw-on cap 315 from the filter body 314. The filter 380 can then be removed and replaced.

It will be appreciated by those of ordinary skill in the art that many variations in the foregoing preferred embodiment are possible while remaining within the scope of the present invention. This invention includes but is not limited to a point-of-use DI water particle reduction unit system for rinsing wafers, the point-of use filtration of nitrogen or pressured air to provide a protective blanket for rinsed wafers, the point-of-use application of hydrogen peroxide for bacteria elimination and prevention, the controlled acceleration and suppression of native oxide formation while rinsing wafers, the controlled injection of chemicals during the rinse process, the reduction and prevention of bubbling and micro bubbling in a rinse system. The present invention should thus not be considered limited to the preferred embodiments or the specific choices of materials, configurations, dimensions, applications, or ranges of parameters employed therein.

What is claimed is:

1. An ultra-pure wafer rinsing system, comprising:
    a filter bank having a fluid input and a fluid output, said filter bank comprising a negatively charged filter operably coupled in series with a positively charged filter, said negatively charged filter and said positively charged filter being contained in a housing; and
    a rinser comprising an inner housing and an outer housing, said inner housing being connected to said fluid output and said outer housing being connected to a drain, said fluid output being located within 2 feet of said rinser.

2. The wafer rinsing system of claim 1, wherein said fluid output is within 1 foot of said rinser.

3. The system of claim 1 wherein said fluid input is coupled to a deionized water source.

4. The system of claim 3 wherein said rinser is adapted to cascade rinse fluid from said inner housing into said outer housing.

5. The system of claim 4 wherein said positively charged filter is a 0.1 micron and less filter.

6. The system of claim 5 wherein said negatively charged filter is a 0.1 micron and less filter.

7. The system of claim 6 wherein said filter bank has a minimal pressure drop.

8. The system of claim 7 wherein said housing includes a conductive shield to enclose said positively charged filter and said negatively charged filter.

9. The system of claim 8 wherein said housing comprises a grounding terminal, said grounding terminal being coupled to said conductive shield.

10. The system of claim 9 wherein said conductive shield is made from a material selected from a group consisting of aluminum and stainless steel.

11. The system of claim 10 wherein said fluid output comprises fluid substantially free from particles less than about 0.1 microns and greater.

12. The system of claim 11 wherein said inner housing is operable with a clean nitrogen gas purge.

13. A semiconductor wafer high purity rinsing system, comprising:

a filter bank having a housing with an input and an output, said filter bank comprising a positively charged filter operably coupled to a negatively charged filter within said housing, said positively charged filter and said negatively charged filter being in series with each other and being coupled to said input and said output, said positively charged filter and said negatively charged filter being 0.1 micron and less filters;

a rinser comprising an inner housing and an outer housing, said inner housing being operably coupled to said output and said outer housing being operably coupled to a drain, said rinser comprising a drain valve in said inner housing to drop a fluid level in said inner housing; and a controller operably coupled to said drain valve to drop said fluid level at a selected signal.

14. The system of claim 13 further comprising a deionized water fluid source coupled to said input, said deionized water source comprising particles greater than about 0.1 microns.

15. The system of claim 14 further comprising a hydrogen peroxide injector operably coupled to said rinser, said hydrogen peroxide injector being adapted to remove bacteria from said rinser.

16. The system of claim 15 further comprising a control valve operably coupled between said rinser and said hydrogen peroxide injector, said control valve being operably coupled to said controller.

17. The system of claim 14 further comprising a hydrogen peroxide injector operably coupled to said filter bank, said hydrogen peroxide injector being adapted to remove bacteria from said filter bank.

18. The system of claim 14 further comprising a gas purger operably coupled to said rinser.

19. The system of claim 18 wherein said gas purger is a clean nitrogen gas purger.

20. The system of claim 14 further comprising an auxiliary injector operably coupled to said rinser.

21. The system of claim 20 further comprising a control valve operably coupled between said auxiliary injector and said rinser, said control valve being operably coupled to said controller.

22. Apparatus for high purity rinsing of semiconductor wafers, said apparatus comprising:

a filter bank having a housing with an input and an output, said input being coupled to a fluid source comprising deionized water, said deionized water comprising particles greater than about 0.1 microns, said housing including a positively charged filter operably coupled to a negatively charged filter therein, said positively charged filter and said negatively charge filter in series with each other and being coupled to said input and said output, said positively charged filter and said negatively charged filter being 0.1 micron and less filters, said deionized water being substantially free from said particles greater than about 0.1 microns at said output;

a rinser comprising an inner housing and an outer housing, said inner housing being operably coupled to said output and said outer housing being operably coupled to a drain, said rinser comprising a drain valve in said inner housing to drop a fluid level in said inner housing;

a gas purger operably coupled to said rinser, said gas purger comprising a control valve to allow gas to purge said rinser to keep the ambient from entering said inner housing, said gas purger providing a gas substantially free from particles greater than about 0.1 microns; and a controller operably coupled to said drain valve to drop said fluid level in said inner housing, said controller being operably coupled to said control valve to purge said gas into said inner housing.

23. The system of claim 22 wherein said rinser is adapted to cascade said fluid from said inner housing into said outer housing.

24. The system of claim 22 wherein said filter bank has a minimal pressure drop.

25. The system of claim 22 wherein said housing includes a conductive shield to enclose said positively charged filter and said negatively charged filter.

26. The system of claim 25 wherein said housing comprises a grounding terminal attached to said conductive shield.

27. The system of claim 26 wherein said conductive shield is made from a material selected from a group consisting of aluminum and stainless steel.

28. The system of claim 27 further comprising a hydrogen peroxide injector operably coupled to said rinser, said hydrogen peroxide injector being adapted to remove bacteria from said rinser.

29. The system of claim 27 further comprising a hydrogen peroxide injector operably coupled to said filter bank, said hydrogen peroxide injector being adapted to remove bacteria from said filter bank.

30. The system of claim 27 further comprising an auxiliary injector operably coupled to said rinser, said auxiliary injector providing a chemical selected from a group consisting of a solvent, a surfactant, an acid, and a caustic.

* * * * *